(12) United States Patent
Kobayashi et al.

(10) Patent No.: US 10,186,610 B2
(45) Date of Patent: Jan. 22, 2019

(54) SEMICONDUCTOR DEVICE AND METHOD OF MANUFACTURING THE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Yusuke Kobayashi, Tsukuba (JP); Manabu Takei, Tsukuba (JP); Shinsuke Harada, Tsukuba (JP)

(73) Assignees: FUJI ELECTRIC CO., LTD., Kawasaki-shi, Kanagawa (JP); NATIONAL INSTITUTE ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/841,461

(22) Filed: Dec. 14, 2017

(65) Prior Publication Data
US 2018/0182884 A1 Jun. 28, 2018

(30) Foreign Application Priority Data
Dec. 22, 2016 (JP) .................................. 2016-248939

(51) Int. Cl.
*H01L 29/78* (2006.01)
*H01L 29/16* (2006.01)
(Continued)

(52) U.S. Cl.
CPC ...... *H01L 29/7806* (2013.01); *H01L 29/0696* (2013.01); *H01L 29/1095* (2013.01);
(Continued)

(58) Field of Classification Search
CPC combination set(s) only.
See application file for complete search history.

(56) References Cited

U.S. PATENT DOCUMENTS

2011/0254010 A1* 10/2011 Zhang ................ H01L 29/0623
 257/66
2012/0261676 A1 10/2012 Nakano
2018/0138300 A1* 5/2018 Baba ................... H01L 29/7397

FOREIGN PATENT DOCUMENTS

JP 2011-134910 A 7/2011

OTHER PUBLICATIONS

Y. Nakano et al., "690V, 1.00mΩcm² 4H-SiC Double-Trench MOSFETs", Materials Science Forum, (Switzerland), Trans Tech Publications Inc., vols. 717-720, pp. 1069-1072, 2012.

* cited by examiner

*Primary Examiner* — Ratisha Mehta
(74) *Attorney, Agent, or Firm* — Rabin & Berdo, P.C.

(57) ABSTRACT

On a front surface of a semiconductor base, a first n⁻-type drift region, a second n-type drift region, and a third n⁺-type drift region are provided. In the front surface of the semiconductor base, a gate trench is provided penetrating the n⁺-type source region and the p-type base region, and reaching the second n-type drift region. Between adjacent gate trenches, a contact trench is provided that penetrates the n⁺-type source region, the p-type base region, and the second and third n-type drift regions, and that reaches the p-type semiconductor region. A source electrode embedded in the contact trench is in contact with the p-type semiconductor region at the bottom and the corners of the contact trench and forms a Schottky junction with the third n⁺-type drift region and the second n-type drift region at a side wall of the contact trench.

15 Claims, 31 Drawing Sheets

(51) Int. Cl.
*H01L 29/10* (2006.01)
*H01L 29/66* (2006.01)
*H01L 29/417* (2006.01)
*H01L 29/06* (2006.01)

(52) U.S. Cl.
CPC .... *H01L 29/1608* (2013.01); *H01L 29/41741* (2013.01); *H01L 29/66068* (2013.01); *H01L 29/7813* (2013.01)

SEMICONDUCTOR DEVICE AND METHOD OF MANUFACTURING THE SEMICONDUCTOR DEVICE

CROSS REFERENCE TO RELATED APPLICATIONS

This application is based upon and claims the benefit of priority of the prior Japanese Patent Application No. 2016-248939, filed on Dec. 22, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Insulated gate type metal oxide semiconductor field effect transistors (MOSFETs) sustaining voltages of 400V, 600V, 1200V, 1700V, 3300V, 6500V or higher are commonly known power semiconductor devices. For example, insulated gate type MOSFETs that use silicon carbide (SiC) (hereinafter, SiC-MOSFETs) are employed in power converting equipment such as converters and inverters. There is demand for these power semiconductor devices to have low loss and high efficiency while at the same time reduce leak current in an OFF state, facilitate size reductions, and improve reliability.

A vertical MOSFET has a built-in parasitic pn diode formed by a p-type base region and an n-type drift region as a body diode between the source and drain. Therefore, a freewheeling diode (FWD) used in an inverter may be omitted, contributing to reductions in cost and size. Nonetheless, when a silicon carbide substrate is used as a semiconductor substrate, compared to a case where a silicon (Si) substrate is used, the parasitic pn diode has a high built-in potential whereby the ON resistance of the parasitic pn diode increases, inviting increased loss. Further, when a parasitic pn diode is turned on and current passes through, characteristics change over time (aging) and reliability decreases due to bipolar operation of the parasitic pn diode.

Regarding these problems, a conventional trench-type SiC-MOSFET (for example, refer to Y. Nakano, et al, "690V, 1.00 mΩcm2 4H—SiC Double-Trench MOSFETs", Materials Science Forum, (Switzerland), Trans Tech Publications Inc. 2012, Vol. No. 717-720, pp. 1069-1072) having a contact trench (source trench) between adjacent gate trenches will be described as an example. A gate trench is a trench in which a gate electrode is embedded via a gate insulating film. A contact trench is a trench in which a metal electrode (source electrode) is embedded and a contact (electrical contact) between the metal electrode and a semiconductor region exposed at an inner wall is formed. First, a structure of a conventional trench-type SiC-MOSFET (hereinafter, a first conventional example) will be described. FIG. 31 is a cross-sectional view of a structure of an active region of a conventional trench-type SiC-MOSFET.

As depicted in FIG. 31, the first conventional example includes, in the active region, a trench-type MOS gate (metal oxide semiconductor insulated gate) structure and a contact trench 108 on a front surface of an n-type semiconductor substrate 110. The active region is a region bearing current driving. In particular, the n-type semiconductor substrate 110 is formed by forming an $n^-$-type layer constituting an $n^-$-type drift region 102 by epitaxial growth on a silicon carbide substrate constituting an $n^+$-type drain layer 101. On a front surface (surface on an $n^-$-type drift region 102 side) side of the n-type semiconductor substrate 110, a MOS gate structure constituted by a p-type base region 103, an $n^+$-type source region 104, a gate trench 105, a gate insulating film 106, and a gate electrode 107 is provided.

To mitigate the electric field applied to the gate insulating film 106 at a bottom of the gate trench 105, a depth of the p-type base region 103 between adjacent gate trenches 105 (mesa) is such that at least a part of the p-type base region 103 is deeper than a depth of the gate trench 105. To make the depth of the p-type base region 103 deeper than the depth of the gate trench 105, at the mesa, the contact trench 108 is provided at a depth deeper than that of the gate trench 105. The p-type base region 103 is provided at the entire inner wall of the contact trench 108 so as to cover a source electrode 111 (described hereinafter), and the p-type base region 103 protrudes deeper on the drain side than the gate trench 105. Further, the p-type base region 103 is exposed at the inner wall of the contact trench 108.

The $n^+$-type source region 104 is selectively provided in the p-type base region 103, between the contact trench 108 and an adjacent gate trench 105. The $n^+$-type source region 104 and the p-type base region 103 exposed at the inner wall of the contact trench 108 are exposed by a contact hole 109a that penetrates an interlayer insulating film 109 in a depth direction. The source electrode 111 is provided as a front electrode, so as to be embedded in the contact hole 109a and the contact trench 108. The source electrode 111 is in contact with the p-type base region 103 and the $n^+$-type source region 104. On a rear surface of the n-type semiconductor substrate 110 (surface on the $n^+$-type drain layer 101 side), a drain electrode (not depicted) is provided as a rear electrode.

When positive voltage is applied to the source electrode 111 and negative voltage is applied to the drain electrode (OFF state of the MOSFET), a pn junction between the p-type base region 103 and the $n^-$-type drift region 102 is forward biased. In the first conventional example, in the OFF state of the MOSFET, when a parasitic pn diode formed by the p-type base region 103 and the $n^-$-type drift region 102 turns on and current passes through, time-related degradation occurs due to the bipolar operation of the parasitic pn diode. Further, when the parasitic pn diode is used as a FWD, since a silicon carbide substrate is used, the ON resistance increases. This issue is resolved by providing between the source and the drain, a built-in parasitic Schottky diode as a body diode (for example, refer to Japanese Laid-Open Patent Publication No. 2011-134910).

A silicon carbide semiconductor increases the breakdown field strength against avalanche breakdown as compared to a silicon semiconductor. Therefore, even for high voltages of 600V or higher, a parasitic Schottky diode may be used as body diode. In particular, the parasitic Schottky diode is provided in parallel with a parasitic pn diode, between the source and the drain, and design is such that in the OFF state of the MOSFET, the parasitic Schottky diode turns on before the parasitic pn diode turns on. As a result, time-related degradation due to the bipolar operation of the parasitic pn diode may be prevented. Further, the parasitic Schottky diode has no built-in pn junction potential and therefore, as a body diode, compared to a case in which only a parasitic pn diode is formed, a low ON resistance may be expected.

SUMMARY OF THE INVENTION

According to an embodiment of the invention, a semiconductor device includes a first semiconductor region of a second conductivity type selectively provided in a first silicon carbide semiconductor layer of a first conductivity type, the first semiconductor region being provided at a position deeper than a surface of the first silicon carbide semiconductor layer; a first silicon carbide semiconductor region of the first conductivity type provided in a surface of the first silicon carbide semiconductor layer, an impurity concentration of the first silicon carbide semiconductor region is higher than that of the first silicon carbide semiconductor layer; a second silicon carbide semiconductor layer of the second conductivity type provided on a surface of the first silicon carbide semiconductor region; a second semiconductor region of the first conductivity type selectively provided in the second silicon carbide semiconductor layer; a first trench penetrating the second semiconductor region, the second silicon carbide semiconductor layer, and the first silicon carbide semiconductor region, the first trench reaching the first silicon carbide semiconductor layer; a second trench provided separated from the first trench, the second trench penetrating the second semiconductor region, the second silicon carbide semiconductor layer, the first silicon carbide semiconductor region, and the first silicon carbide semiconductor layer, the second trench reaching the first semiconductor region; a gate electrode provided in the first trench, via a gate insulating film; and a metal electrode in contact with the second semiconductor region, the second silicon carbide semiconductor layer, and the first silicon carbide semiconductor region, the metal electrode embedded in the second trench so as to be in contact with the first semiconductor region at a bottom and a corner of the second trench, the metal electrode forming a Schottky junction with the first silicon carbide semiconductor region and the first silicon carbide semiconductor layer at a side wall of the second trench.

In the embodiment, the first silicon carbide semiconductor region is selectively provided in the surface of the first silicon carbide semiconductor layer, and the second silicon carbide semiconductor layer is provided on the surfaces of the first silicon carbide semiconductor layer and the first silicon carbide semiconductor region.

In the embodiment, the first silicon carbide semiconductor region is selectively provided in the surface of the first silicon carbide semiconductor layer. The semiconductor device further includes a second silicon carbide semiconductor region of the first conductivity type provided in the surface of the first silicon carbide semiconductor layer so as to be in contact with the first silicon carbide semiconductor region and the first trench, an impurity concentration of the second silicon carbide semiconductor region is higher than that of the first silicon carbide semiconductor layer. The second silicon carbide semiconductor layer is provided on the surface of the first silicon carbide semiconductor region and a surface of the second silicon carbide semiconductor region.

In the embodiment, the first silicon carbide semiconductor region is selectively provided in the surface of the first silicon carbide semiconductor layer. The semiconductor device further includes a second silicon carbide semiconductor region of the first conductivity type provided in the surface of the first silicon carbide semiconductor layer so as to be in contact with the first silicon carbide semiconductor region and the first trench, an impurity concentration of the second silicon carbide semiconductor region is lower than that of the first silicon carbide semiconductor layer; and a third silicon carbide semiconductor region of the first conductivity type provided in the surface of the first silicon carbide semiconductor layer so as to be in contact with the first silicon carbide semiconductor region and the second trench. The second silicon carbide semiconductor layer is provided on the surface of the first silicon carbide semiconductor region, a surface of the second silicon carbide semiconductor region, and a surface of the third silicon carbide semiconductor region.

In the embodiment, a width of the first semiconductor region is wider than a width of the second trench.

In the embodiment, a depth of the second trench is a depth of the first trench or more.

In the embodiment, semiconductor device further includes a fourth semiconductor region of the second conductivity type selectively provided in the first silicon carbide semiconductor layer, the fourth semiconductor region facing the gate electrode via the gate insulating film at a bottom and a corner of the first trench.

In the embodiment, a depth of the second trench is a depth of the first trench or less.

In the embodiment, the semiconductor device further includes a fifth semiconductor region of the second conductivity type selectively provided in the second silicon carbide semiconductor layer, an impurity concentration of the fifth semiconductor region is higher than that of the second silicon carbide semiconductor layer. The second semiconductor region and the fifth semiconductor region are arranged to repeatedly alternate along a direction orthogonal to a direction along which the first trench and the second trench are arranged.

In the embodiment, the semiconductor device further includes a third silicon carbide semiconductor layer of the first conductivity type provided on a first surface of the first silicon carbide semiconductor layer, the first surface is opposite a second surface of the first silicon carbide semiconductor layer, the second surface faces toward the second silicon carbide semiconductor layer, an impurity concentration of the third silicon carbide semiconductor layer is higher than that of the first silicon carbide semiconductor layer.

According to another embodiment of the invention, a method of manufacturing a semiconductor device includes selectively forming a first semiconductor region of a second conductivity type in a first silicon carbide semiconductor layer of a first conductivity type, the first semiconductor region formed at a position deeper than a surface of the first silicon carbide semiconductor layer; forming a first silicon carbide semiconductor region of the first conductivity type in a surface of the first silicon carbide semiconductor layer, an impurity concentration of the first silicon carbide semiconductor region is higher than that of the first silicon carbide semiconductor layer; forming a second silicon carbide semiconductor layer of the second conductivity type on a surface of the first silicon carbide semiconductor region; selectively forming a second semiconductor region of the first conductivity type in the second silicon carbide semiconductor layer; forming a first trench penetrating the second semiconductor region, the second silicon carbide semiconductor layer, and the first silicon carbide semiconductor region, the first trench reaching the first silicon carbide semiconductor layer; forming a second trench separated from the first trench, the second trench penetrating the second semiconductor region, the second silicon carbide semiconductor layer, the first silicon carbide semiconductor region, and the first silicon carbide semiconductor layer, the second trench reaching the first semiconductor region; forming a gate electrode in the first trench, via a gate insulating film; and embedding a metal electrode in the second trench so as to be in contact with the first semiconductor region at a bottom and a corner of the second trench, the metal electrode formed to be in contact with the second semiconductor region, the second silicon carbide semiconductor layer, and the first silicon carbide semiconductor region, the metal electrode forming a Schottky junction with the first silicon carbide semiconductor region and the first silicon carbide semiconductor layer at a side wall of the second trench.

In the embodiment, the first silicon carbide semiconductor region is selectively provided in the surface of the first silicon carbide semiconductor layer. The second silicon carbide semiconductor layer is provided on the surfaces of the first silicon carbide semiconductor layer and the first silicon carbide semiconductor region.

In the embodiment, the first silicon carbide semiconductor region is selectively provided in the surface of the first silicon carbide semiconductor layer. The method further includes forming a second silicon carbide semiconductor region of the first conductivity type in the surface of the first silicon carbide semiconductor layer so as to be in contact with the first silicon carbide semiconductor region and the first trench, an impurity concentration of the second silicon carbide semiconductor region is higher than that of the first silicon carbide semiconductor layer, the second silicon carbide semiconductor region is formed after forming the first silicon carbide semiconductor region and before forming the second silicon carbide semiconductor layer. The second silicon carbide semiconductor layer is formed on the surface of the first silicon carbide semiconductor region and a surface of the second silicon carbide semiconductor region.

In the embodiment, the first silicon carbide semiconductor region is selectively provided in the surface of the first silicon carbide semiconductor layer. The method further includes forming a second silicon carbide semiconductor region of the first conductivity type in the surface of the first silicon carbide semiconductor layer so as to be in contact with the first silicon carbide semiconductor region and the first trench, an impurity concentration of the second silicon carbide semiconductor region is lower than that of the first silicon carbide semiconductor layer. The second silicon carbide semiconductor region is formed after forming the first silicon carbide semiconductor region and before forming the second silicon carbide semiconductor layer. The method further includes forming a third silicon carbide semiconductor region of the first conductivity type in the surface of the first silicon carbide semiconductor layer so as to be in contact with the first silicon carbide semiconductor region and the second trench. The third silicon carbide semiconductor region is formed after forming the first silicon carbide semiconductor region and before forming the second silicon carbide semiconductor layer. The second silicon carbide semiconductor layer is formed on the surface of the first silicon carbide semiconductor region, the surface of the second silicon carbide semiconductor region, and a surface of the third silicon carbide semiconductor region.

In the embodiment, forming the first semiconductor region includes selectively forming a fourth semiconductor region of the second conductivity type in the first silicon carbide semiconductor layer, the fourth semiconductor region facing the gate electrode via the gate insulating film at a bottom and a corner of the first trench.

Objects, features, and advantages of the present invention are specifically set forth in or will become apparent from the following detailed description of the invention when read in conjunction with the accompanying drawings.

DETAILED DESCRIPTION OF THE INVENTION

In Japanese Laid-Open Patent Publication No. 2011-134910, a problem arises in that in the OFF state of the MOSFET, high electric field is applied to a Schottky junction formed at the bottom of the contact trench whereby a high leak current flows via the Schottky junction.

Therefore, a semiconductor device that may prevent time-related degradation due to the bipolar operation of the parasitic pn diode and that may reduce leak current has been proposed (hereinafter, a second conventional example). For example, FIG. 32 is a cross-sectional view of an example of the structure of the active region of another conventional trench-type SiC-MOSFET.

Figure 32:
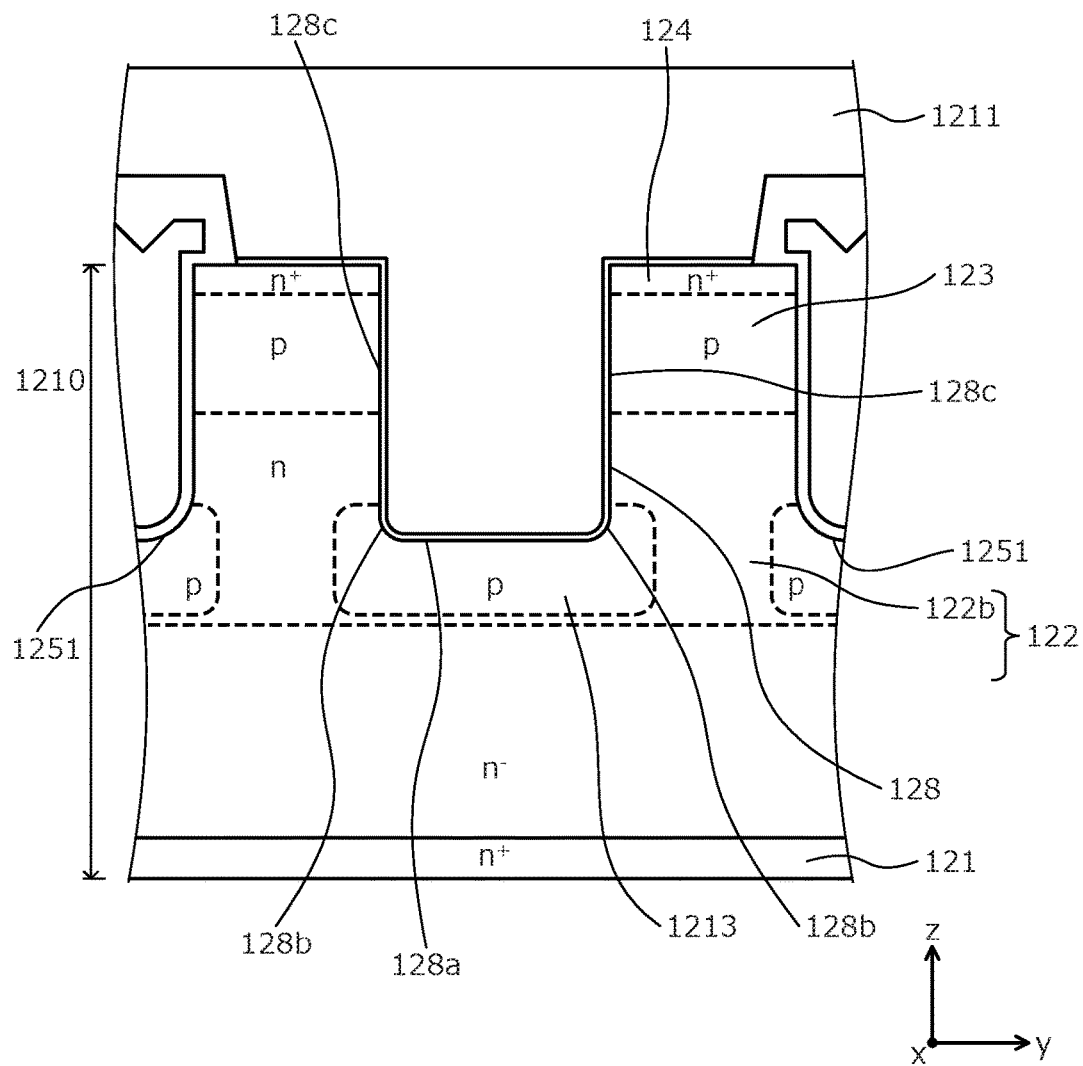
FIG. 32 is a cross-sectional view of an example of a structure of an active region of another conventional trench-type SiC-MOSFET.

In the second conventional example, as depicted in FIG. 32, in a front surface of a semiconductor base 1210 in which an n-type drift region 122 and a p-type base region 123 are sequentially formed on an n$^+$-type drain layer 121, a gate trench 1251 is provided that penetrates an n$^+$-type source region 124 and the p-type base region 123, and reaches a second n-type drift region 122b. In the second n-type drift region 122b, a p-type semiconductor region 1213 is selectively provided. Between adjacent gate trenches 1251, a contact trench 128 is provided that penetrates the n$^+$-type source region 124, the p-type base region 123 and the second n-type drift region 122b, and reaches the p-type semiconductor region 1213. A source electrode 1211 embedded in the contact trench 128 is in contact with the p-type semiconductor region 1213 at a bottom 128a and corners 128b of the contact trench 128, and forms a Schottky junction with the second n-type drift region 122b at side walls 128c of the contact trench 128.

In the second conventional example, a Schottky junction of the n-type drift region and the metal electrode is formed only at the side walls of the contact trench and therefore, when the parasitic Schottky diode formed by the n-type drift region and the metal electrode is turned on, the parasitic pn diode formed by the p-type base region and the n-type drift region does not turn on. As a result, time-related degradation due to the bipolar operation of the parasitic pn diode does not occur.

Further, the metal electrode is covered by the n-type drift region at the entire surface at the corners and the bottom of the contact trench whereby in the OFF state of the MOSFET, the electric field applied to the Schottky junction of the n-type drift region and the metal electrode may be mitigated. As a result, leak current of the parasitic Schottky diode may be reduced.

Further, the p-type semiconductor region is provided covering the gate electrode at the entire surface at the corners and the bottom of the gate trench, via the gate insulating film whereby the electric field applied to the gate insulating film at the bottom of the gate trench may be mitigated.

However, in the trench-type silicon carbide semiconductor device depicted in FIG. 32, the resistance of the n-type drift region is high and therefore, when the parasitic Schottky diode is on, hole current increases and the parasitic pn diode may turn on. In this case, time-related degradation due to the bipolar operation of the parasitic pn diode occurs.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without +or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 1:
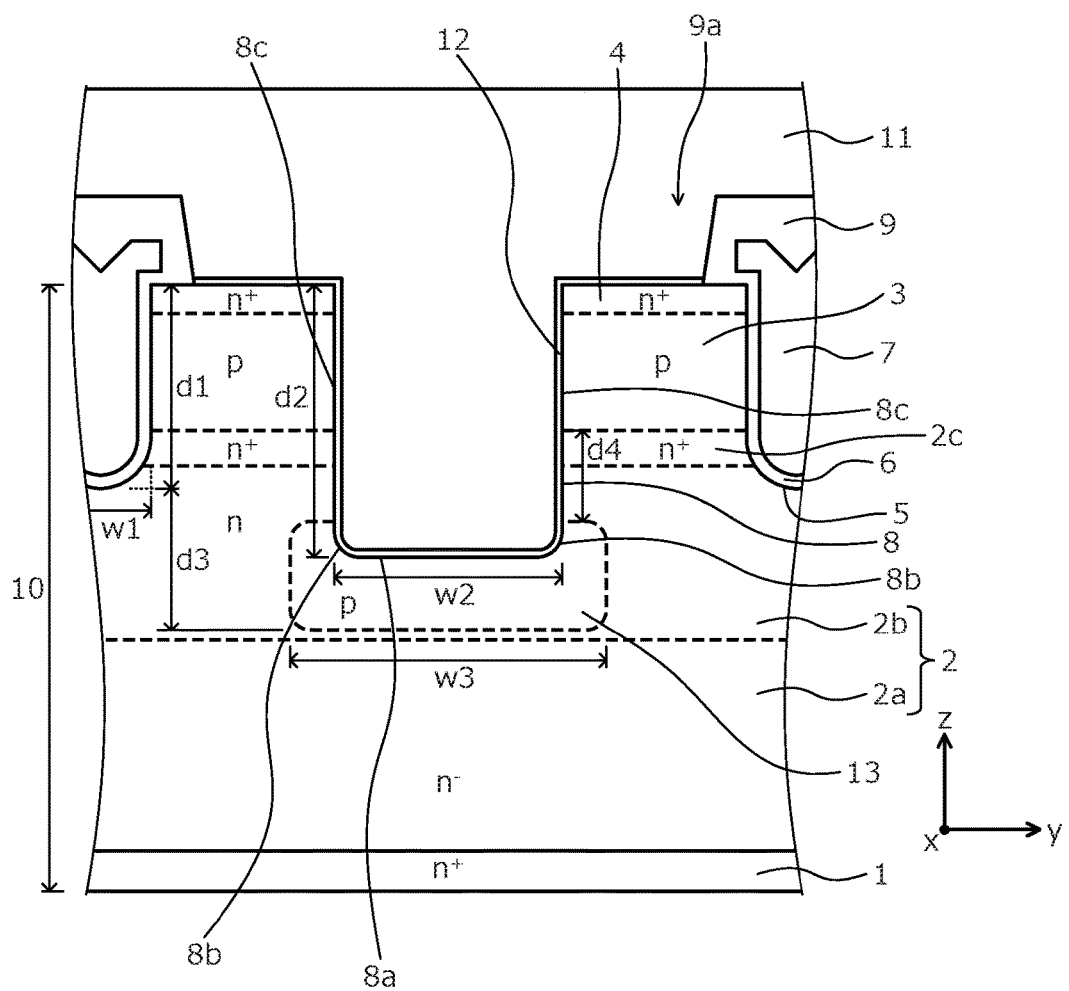
FIG. 1 is a cross-sectional view of a structure of an active region of a semiconductor device according to a first embodiment.
Figure 2:
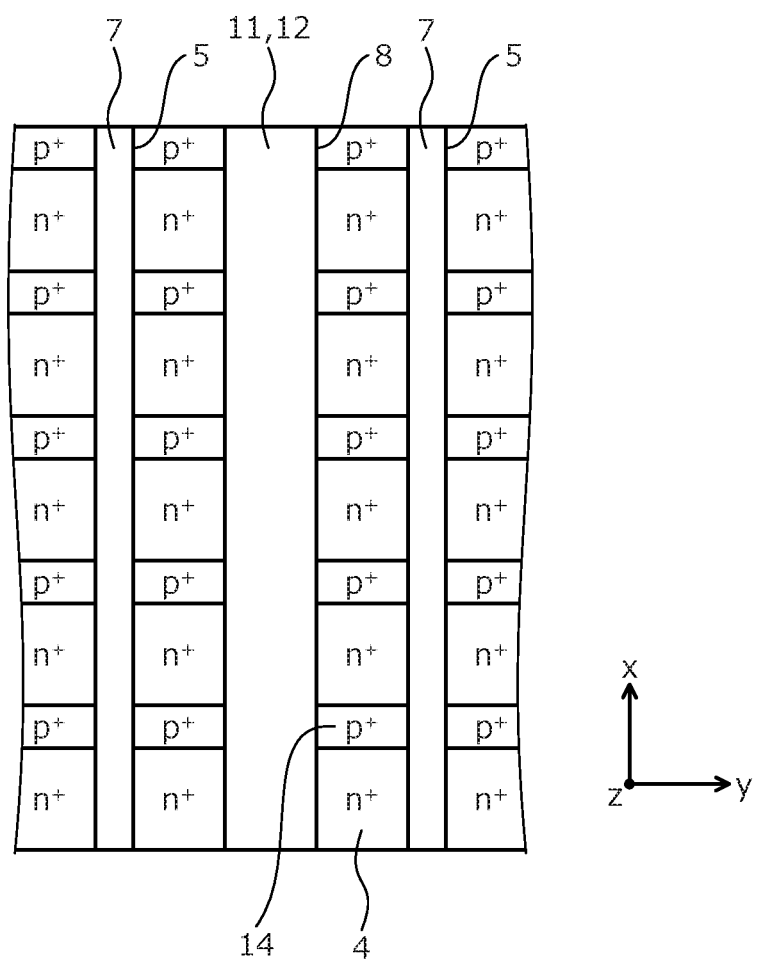
FIG. 2 is a plan view of a planar layout near a contact trench in FIG. 1.

A structure of the semiconductor device according to a first embodiment will be described. FIG. 1 is a cross-sectional view of a structure of an active region of the semiconductor device according to the first embodiment. FIG. 2 is a plan view of a planar layout near a contact trench in FIG. 1. In FIG. 2, a gate insulating film 6 (described hereinafter) is not depicted. The semiconductor device according to the first embodiment and depicted in FIG. 1 is a trench-type SiC-MOSFET that includes in the active region, a gate trench (first trench) 5 and a contact trench (second trench) 8 in a front surface side of a semiconductor base (semiconductor chip) 10. The active region is a region that bears current driving (a region through which current flows in the ON state). The gate trench 5 is a trench in which a gate electrode 7 is embedded via the gate insulating film 6. The contact trench 8 is a trench in which a front electrode (metal electrode: a source electrode 11 and a metal film 12) is embedded, and in which a contact (electrical contact) with the front electrode is formed at inner walls 8a to 8c of the trench. The front electrode is described hereinafter.

In particular, as depicted in FIGS. 1 and 2, the semiconductor base 10 is, for example, a silicon carbide epitaxial substrate on which an n-type epitaxial layer (first silicon carbide semiconductor layer) constituting an n-type drift region 2 and a p-type epitaxial layer (second silicon carbide semiconductor layer) constituting a p-type base region 3 are sequentially grown on an n$^+$-type silicon carbide (SiC) substrate (third silicon carbide semiconductor layer) constituting an n$^+$-type drain layer 1. The n-type drift region 2 is constituted by an n$^−$-type region (hereinafter, first n$^−$-type drift region) 2a, an n-type region (hereinafter, second n-type drift region) 2b, and an n$^−$-type region (first silicon carbide semiconductor region of the first conductivity type) (hereinafter, third n$^+$-type drift region) 2c of differing impurity concentrations and sequentially stacked on the n$^+$-type drain layer 1. On a front surface (surface on the epitaxial layer side) side of the semiconductor base 10, a trench-type MOS gate structure is provided. The trench-type MOS gate structure includes the p-type base region 3, an n$^+$-type source region (second semiconductor region) 4, a p$^+$-type contact region (fifth semiconductor region) 14, the gate trench 5, the gate insulating film 6, and the gate electrode 7.

The p-type base region 3 is formed by epitaxial growth on a first side (surface of the second n-type drift region 2b) of the n-type drift region 2, opposite a second side of the n-type drift region 2, the second side facing the n$^+$-type drain layer 1. The n$^+$-type source region 4 and the p$^+$-type contact region 14 are diffusion regions selectively formed in the p-type base region 3, for example, by ion implantation. The n$^+$-type source region 4 faces the gate electrode 7 across the gate insulating film 6 described hereinafter. The n$^+$-type source region 4 and the p$^+$-type contact region 14 are arranged between the gate trench 5 and the contact trench 8 that are arranged in a striped planar layout, as described hereinafter. The n$^+$-type source region 4 and the p$^+$-type contact region 14 are arranged to repeatedly alternate along a direction (hereinafter, first direction) x in which the gate trench 5 and the contact trench 8 extend in the striped shape. The p$^+$-type contact region 14 has a function of reducing the contact resistance with the front electrode.

The gate trench 5 is arranged in a striped planar layout extending along the first direction x. The gate trench 5 penetrates the n$^+$-type source region 4, the p$^+$-type contact region 14, the p-type base region 3, and the third n$^+$-type drift region 2c from the base front surface, and reaches the second n-type drift region 2. In the gate trench 5, the gate insulating film 6 is provided along inner walls of the gate trench 5, and the gate electrode 7 is provided on the gate insulating film 6. In other words, the gate electrode 7 faces the n$^+$-type source regions 4 and the p$^+$-type contact regions 14 across the gate insulating film 6 provided on the side walls of the gate trench 5. In FIG. 1, while only a region (mesa) between adjacent gate trenches 5 is depicted, the gate trenches 5 are arranged for each unit cell (functional unit of an element) arranged in the active region (similarly for other drawings in which the gate trench 5 is depicted).

The contact trench 8 is arranged between adjacent gate trenches 5, parallel to the gate trenches 5, and separated from the gate trenches 5, in a striped planar layout extending along the first direction x. For example, when the contact trench 8 is arranged in all mesas, the gate trench 5 and the contact trench 8 are arranged to repeatedly alternate and be separate from each other along a direction (hereinafter, second direction) y orthogonal to the first direction x. The contact trench 8 penetrates the n$^+$-type source region 4, the p$^+$-type contact region 14, the p-type base region 3, and the third n$^+$-type drift region 2c from the base front surface, and penetrates the second n-type drift region 2b and reaches a p-type semiconductor region 13 described hereinafter. A depth d2 of the contact trench 8 is a depth d1 of the gate trench 5 or deeper (d2≥d1). A width w2 of the contact trench 8 may be wider than a width w1 of the gate trench 5 (w2>w1).

In the second n-type drift region 2b, near a boundary with the first n$^-$-type drift region 2a, the p-type semiconductor region (first semiconductor region) 13 is selectively provided. The contact trench 8 reaches the p-type semiconductor region 13 and a surface of the p-type semiconductor region 13 is entirely exposed at a bottom 8a and corners 8b of the contact trench 8. The corners 8b of the contact trench 8 are locations where the bottom 8a and side walls 8c of the contact trench 8 intersect, and are corners curved at a predetermined curvature. A width w3 of the p-type semiconductor region 13 is wider than the width w2 of the contact trench 8 (w3>w2). In other words, the p-type semiconductor region 13 is exposed at the bottom 8a and the corners 8b of the contact trench 8; and the n$^+$-type source region 4, the p$^+$-type contact region 14, the p-type base region 3, the third n$^+$-type drift region 2c, and the second n-type drift region 2b are exposed at the side walls 8c of the contact trench 8.

A depth of the p-type semiconductor region 13 from the base front surface may be shallower than a depth of the second n-type drift region 2b. In other words, the p-type semiconductor region 13 may be arranged to be separated from an interface of the first n$^-$-type drift region 2a and the second n-type drift region 2b. A reason for this is that the breakdown voltage of the active region may be made lower than a breakdown voltage of an edge termination region (not depicted). The edge termination region is a region that surrounds a periphery of the active region and mitigates electric field at the base front surface side of the third n$^+$-type drift region 2c to thereby sustain the breakdown voltage. The bottom of the gate trench 5 and a bottom surface (surface on the drain side) of the p-type semiconductor region 13 may be separated by a distance d3 that at the bottom of the gate trench 5, enables electric field to be mitigated to an extent that dielectric breakdown of the gate insulating film 6 may be avoided.

An interlayer insulating film 9 is provided so as to cover the gate electrode 7. In a contact hole 9a that penetrates the interlayer insulating film 9 in a depth direction z, the n$^+$-type source region 4 and the p$^+$-type contact region 14 that are exposed at the base front surface are exposed, and the above-mentioned semiconductor regions are exposed at the inner walls of the contact trench 8. Along the base front surface and the inner walls of the contact trench 8 exposed by the contact hole 9a, the metal film 12 containing, for example, nickel (Ni), is provided. The metal film 12 functions as the source electrode 11 (described hereinafter) and the front electrode. The metal film 12 is in contact with the n$^+$-type source region 4 and the p$^+$-type contact region 14, along the base front surface and the side walls 8c of the contact trench 8. As a result, the area of contact between the front electrode and the regions (the n$^+$-type source region 4 and the p$^+$-type contact region 14) formed on the base front surface side increases, enabling the contact resistance to be reduced. Further, a reduction in size becomes possible without increased contact resistance.

The metal film 12 is in contact with the p-type semiconductor region 13 along the entire surface at the bottom 8a and the corners 8b of the contact trench 8. At the side walls 8c of the contact trench 8, the metal film 12 is in contact with the second n-type drift region 2b and the third n$^+$-type drift region 2c, and forms a Schottky junction with the second n-type drift region 2b and the third n$^+$-type drift region 2c. In other words, the Schottky junction is formed only at a part of the side walls 8c of the contact trench 8, from a pn junction between the p-type base region 3 and the third n$^+$-type drift region 2c to an upper end (end on the source side) of the p-type semiconductor region 13. A distance d4 in the depth direction z along the part of the side walls 8c of the contact trench 8 where the Schottky junction is formed may be a height that is 1/10 or more with respect to cell pitch. A reason for this is that when a parasitic Schottky diode between the front electrode and the second n-type drift region 2b and the third n$^+$-type drift region 2c (described hereinafter) turns on, current 33 (refer to FIG. 3) from the source side toward the drain side may sufficiently flow so as to apply voltage that is the built-in voltage or higher on the parasitic pn diode to an extent satisfying function as a FWD. The cell pitch is a distance between centers of adjacent contact trenches 8 that sandwich one gate trench 5 therebetween.

The source electrode 11 is provided in the contact hole 9a and the contact trench 8, via the metal film 12, and is electrically connected to the n$^+$-type source region 4, the p$^+$-type contact region 14, the p-type base region 3, the third n$^+$-type drift region 2c, the second n-type drift region 2b, and the p-type semiconductor region 13. Thus, when the MOSFET is off, as described hereinafter, at the bottom 8a and the corners 8b of the contact trench 8, a parasitic pn diode 22 of the p-type semiconductor region 13 and the second n-type drift region 2b is formed (refer to FIG. 3). Further, at the side walls 8c of the contact trench 8, a parasitic Schottky diode 23 of the front electrode (the source electrode 11 and the metal film 12) and the second n-type drift region 2b and the third n+-type drift region 2c is formed. In other words, between the source and the drain, the parasitic Schottky diode 23 is formed in parallel to a parasitic pn diode 21 (refer to FIG. 3). On a rear surface (surface on the n+-type drain layer 1 side) of the semiconductor base 10, a drain electrode (not depicted) is provided as a rear electrode. The n+-type drain layer 1 has a function of reducing the contact resistance with the drain electrode.

Figure 3:
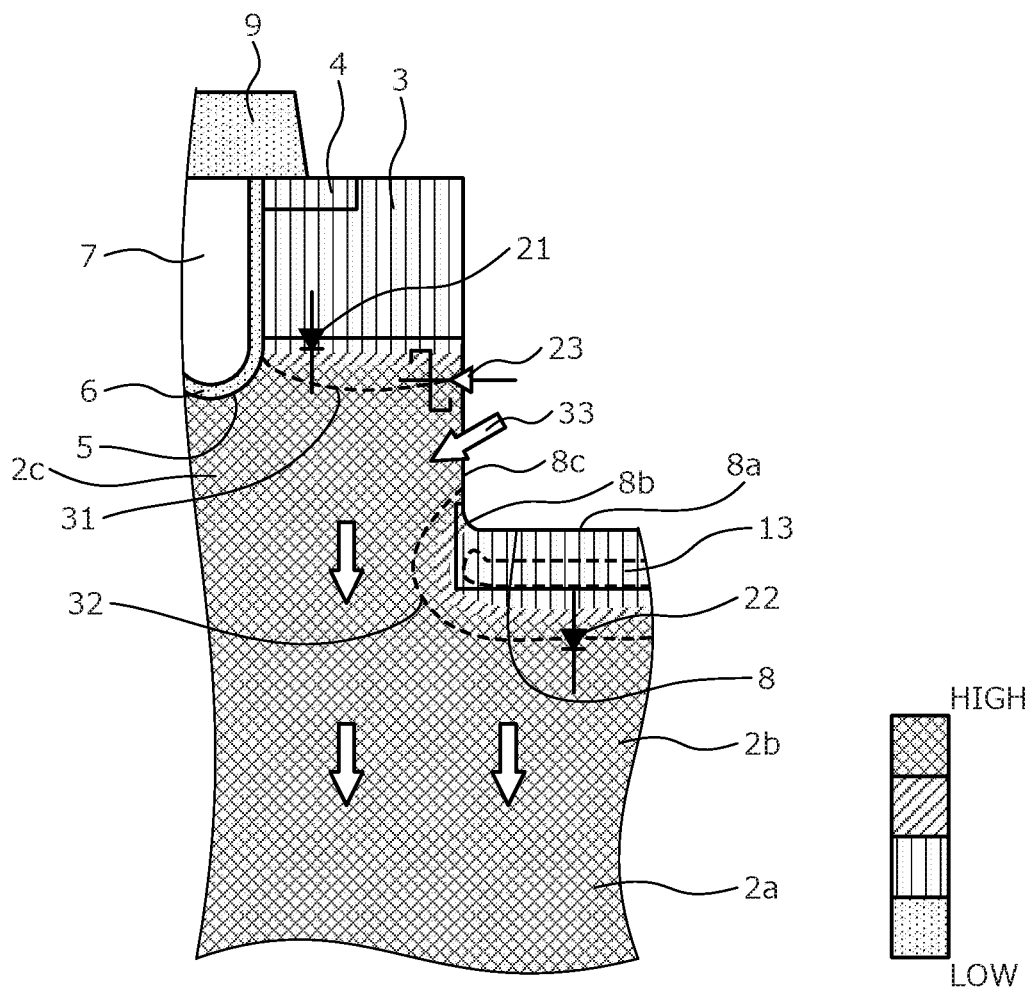
FIG. 3 is a diagram depicting operation when the semiconductor device according to the first embodiment is in an OFF state.

Operation (current flow) when the semiconductor device according to the first embodiment is in the OFF state will be described. FIG. 3 is a diagram depicting operation when the semiconductor device according to the first embodiment is in the OFF state. In FIG. 3, white arrows represent the flow of the current 33 when the MOSFET depicted in FIGS. 1 and 2 is in the OFF state. In FIG. 3, the metal film 12 in FIG. 1 is not depicted. When positive voltage is applied to the front electrode and negative voltage is applied to the drain electrode (when the MOSFET is off), near the bottom 8a and the corners 8b of the contact trench 8, a depletion layer 32 spreads from a pn junction between the p-type semiconductor region 13 and the second n-type drift region 2b. As described, a Schottky junction between the front electrode and the second n-type drift region 2b and the third n+-type drift region 2c is formed at the side walls 8c of the contact trench 8 whereby the spread of the depletion layer 32 from the pn junction between the p-type semiconductor region 13 and the second n-type drift region 2b hinders the application of electric field to the parasitic Schottky diode 23 in the OFF state. Reference numeral 31 represents a depletion layer that spreads from the pn junction between the p-type base region 3 and the second n-type drift region 2b in the OFF state of the MOSFET. In the ON state, the current 33 flows from the source side to the drain side via the parasitic Schottky diode 23 formed at the side walls 8c of the contact trench 8, without passing through the parasitic pn diode 21 formed by the p-type base region 3 and the third n+-type drift region 2c. In other words, in the ON state, among body diodes formed in the silicon carbide substrate, only the parasitic Schottky diode 23 operates; the parasitic pn diode 21 formed by the p-type base region 3 and the third n+-type drift region 2c, and the parasitic pn diode 22 formed by the p-type semiconductor region 13 and the second n-type drift region 2b do not operate. Thus, the parasitic pn diodes 21, 22 are not turned on and therefore, time-related degradation due to the bipolar operation thereof does not occur.

The method of manufacturing a semiconductor device according to the first embodiment will be described taking as an example, a case in which a 3300V trench-type SiC-MOSFET is produced (manufactured). FIGS. 4, 5, 6, 7, 8, 9, and 10 are cross-sectional views of the semiconductor device according to the first embodiment during manufacture. First, on a front surface a silicon carbide substrate (semiconductor wafer) constituting the n+-type drain layer 1, an n−-type epitaxial layer constituting the first n−-type drift region 2a and having a thickness of, for example, 30 μm is grown (formed). An impurity concentration of the n+-type drain layer 1 may be, for example, about $1\times10^{18}/cm^3$ to $1\times10^{20}/cm^3$. An impurity concentration of the first n−-type drift region 2a may be, for example, about $2\times10^{15}/cm^3$ to $2\times10^{16}/cm^3$.

Next, in a surface layer of the first n−-type drift region 2a in the active region, at a depth of, for example, about 0.3 μm to 1.5 μm, the second n-type drift region 2b is formed by photolithography and ion implantation of an n-type impurity such as phosphorus (P) or nitrogen (N). An impurity concentration of the second n-type drift region 2b may be, for example, about $1\times10^{16}/cm^3$ to $1\times10^{18}/cm^3$. Next, in a surface layer of the second n-type drift region 2b, at a depth of about 0.3 μm to 1.5 μm, the p-type semiconductor region 13 is selectively formed by photolithography and ion implantation of a p-type impurity such as aluminum (Al). An impurity concentration of the p-type semiconductor region 13 may be, for example, about $1\times10^{16}/cm^3$ to $1\times10^{18}/cm^3$.

Figure 4:
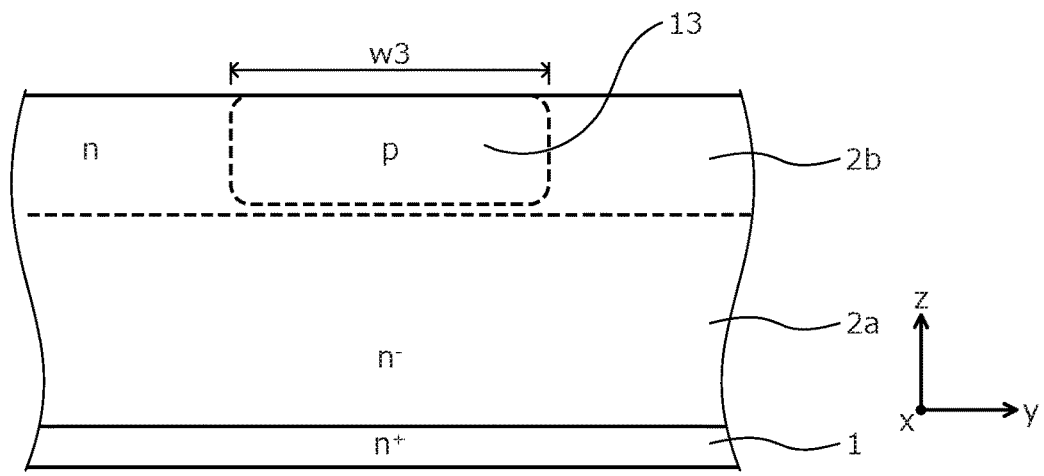
FIGS. 4, 5, 6, 7, 8, 9, and 10 are cross-sectional views of the semiconductor device according to the first embodiment during manufacture.

The width w3 of the p-type semiconductor region 13, for example, may be wider than that of the subsequently formed contact trench 8 by 0.05 μm or more from the outer side of each side wall of the contact trench 8 and, in particular, may be about 0.05 μm to 5.0 μm wider on each side of the contact trench 8. A reason for this is that when the width w3 of the p-type semiconductor region 13 is narrower that the range above, leak current increases in the OFF state of the MOSFET, and when the width w3 wider than the range above, high performance become difficult to achieve due to the decreased cell pitch. Further, in this case, the p-type semiconductor region 13 may be formed so as to be at a depth not reaching the first n−-type drift region 2a. A reason for this is as described above. As described, from the perspective of mitigating the electric field at the gate insulating film 6, the distance d3 from the bottom of the gate trench 5 to the surface on a lower side (drain side) of the p-type semiconductor region 13 may be, for example, about 1.0 μm to 2.5 μm. The state up to here is depicted in FIG. 4.

Figure 5:
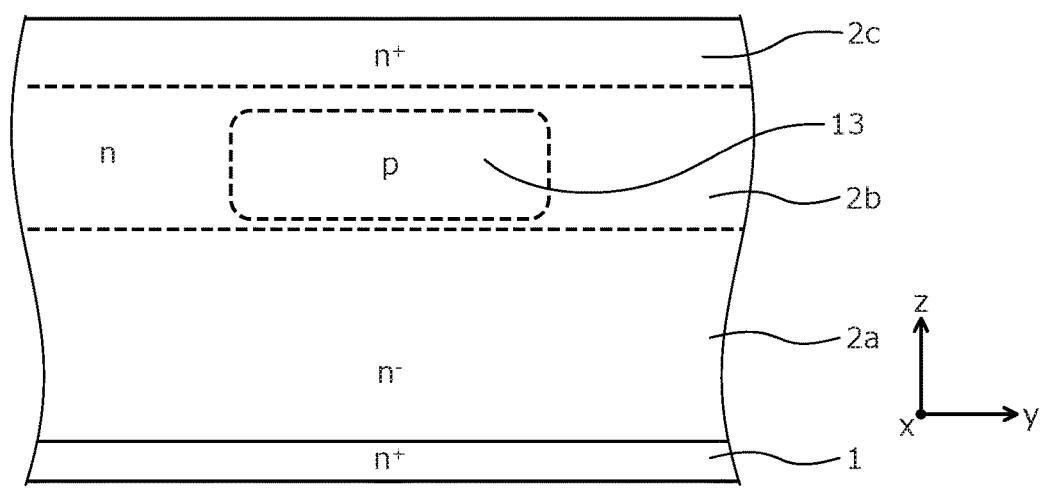

Next, an n-type epitaxial layer is formed by epitaxial growth so as to cover the p-type semiconductor region 13 and have, for example, a concentration of $1\times10^{16}/cm^3$ to $1\times10^{18}/cm^3$ and, for example, a thickness of about 0.5 μm to 3.0 μm whereby the thickness of the second n-type drift region 2b is increased. Next, in the surface layer of the second n-type drift region 2b, the third n+-type drift region 2c is selectively formed by photolithography and ion implantation of an n-type impurity such as phosphorus or nitrogen. An impurity concentration of the third n+-type drift region 2c may be, for example, about $5\times10^{16}/cm^3$ to $5\times10^{18}/cm^3$. A reason for this is that when the impurity concentration is less than $5\times10^{16}/cm^3$, the impurity concentration does not become higher than that of the second n-type drift region 2b and when the impurity concentration is higher than $5\times10^{18}/cm^3$, the front electrode and the Schottky junction form an ohmic contact whereby the parasitic Schottky diode is not formed. The state up to here is depicted in FIG. 5.

Next, a p-type epitaxial layer constituting the p-type base region 3 is formed on the surface of the third n+-type drift region 2c by epitaxial growth to have a thickness of, for example, about 0.3 μm to 2.0 μm. By the processes up to here, the semiconductor base (silicon carbide epitaxial wafer) 10 in which the n-type epitaxial layer constituting the n-type drift region 2 and the p-type epitaxial layer constituting the p-type base region 3 are sequentially grown on the silicon carbide substrate constituting the n+-type drain layer 1 is produced. An impurity concentration of the p-type base region 3 may be, for example, about $1\times10^{15}/cm^3$ to $1\times10^{19}/cm^3$.

Figure 6:
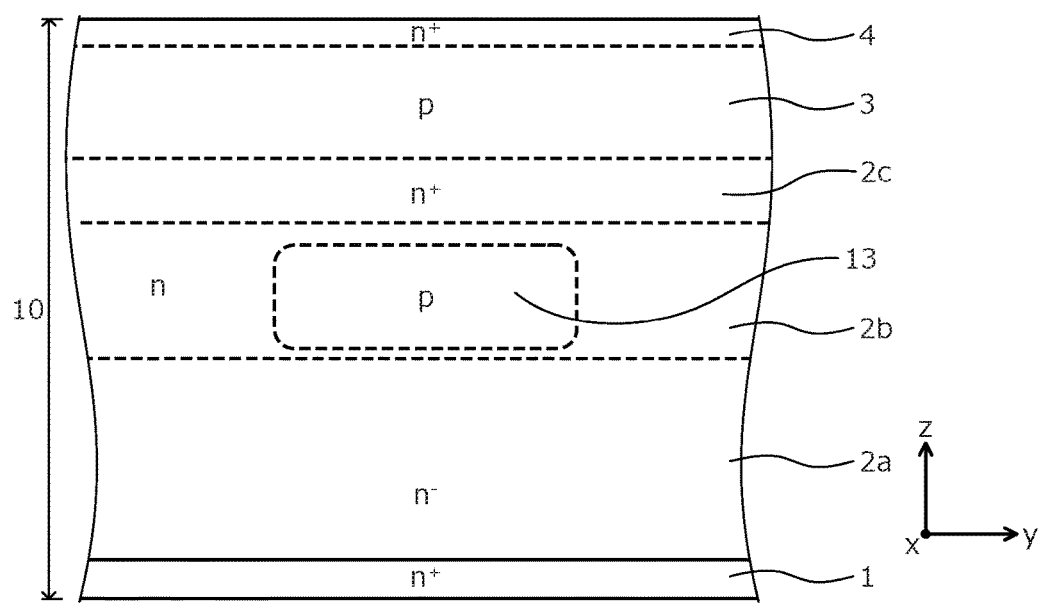

Next, the n+-type source region 4 is selectively formed in the surface layer of the p-type base region 3 by photolithography and ion implantation of an n-type impurity such as phosphorus or nitrogen. Next, the p+-type contact region 14 is selectively formed in the surface layer of the p-type base region 3 by photolithography and ion implantation of a p-type impurity such as aluminum, so as to be alternately arranged with the n+-type source region 4 along the first direction x. An impurity concentration of the n+-type source region 4 may be, for example, about $1\times10^{18}/cm^3$ to $1\times10^{20}/cm^3$. An impurity concentration of the p+-type contact region 14 may be, for example, about $1 \times 10^{18}/cm^3$ to $1 \times 10^{20}/cm^3$. Depths of the n⁺-type source region 4 and the p⁺-type contact region 14 may both be, for example, about 0.1 µm to 0.5 µm. The sequence in which the n⁺-type source regions 4 and the p⁺-type contact regions 14 are formed may be interchanged. The state up to here is depicted in FIG. 6.

Figure 7:
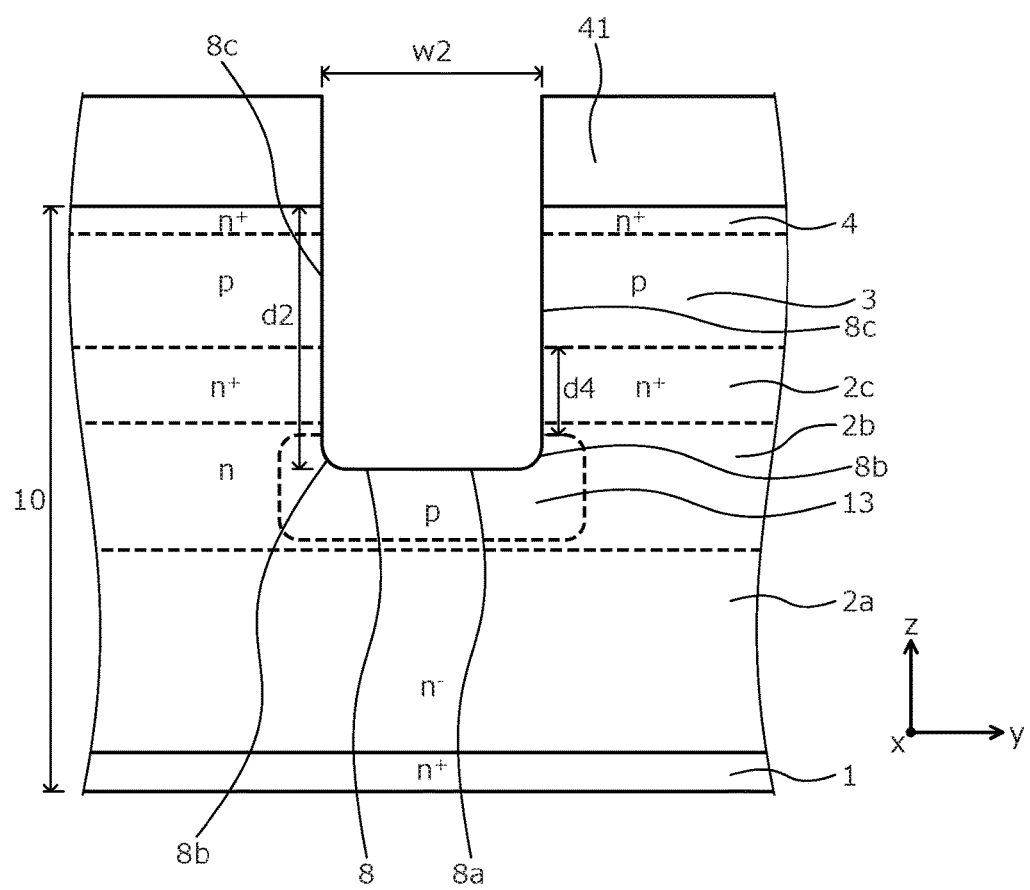

Next, on the base front surface (surface on the n⁺-type source region 4 side), an oxide film 41 is deposited (formed) to have a thickness of, for example, about 1.5 µm to 2.5 µm. Next, the oxide film 41 is patterned by photolithography and etching to remove a part of the oxide film 41 corresponding to the contact trench 8. Next, after a resist mask (not depicted) used in patterning the oxide film 41 is removed, etching is performed using the remaining part of the oxide film 41 as a mask, to form the contact trench 8 at the depth d2 so that the bottom 8a and the corners 8b reach the p-type semiconductor region 13. Here, subsequently, the second n-type drift region 2b is exposed at the side walls 8c of the contact trench 8 so that the distance d4 in the depth direction z of the Schottky junction formed at the side walls 8c of the contact trench 8 satisfies the range described. In particular, the depth d2 of the contact trench 8 may be the depth d1 of the gate trench 5 (described hereinafter) or more, for example, about 1.0 µm to 5.0 µm. Further, the width w2 of the contact trench 8 may be, for example, about 0.1 µm to 3.0 µm. The state up to here is depicted in FIG. 7.

Figure 8:
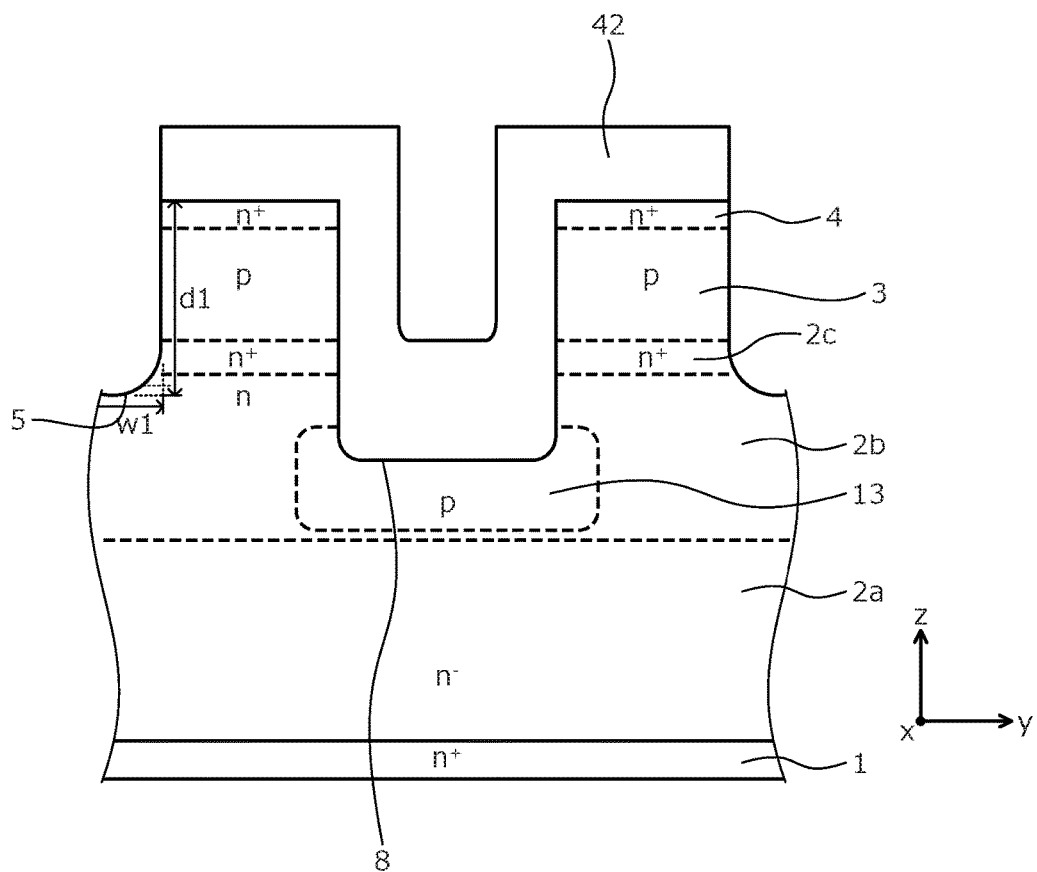

Next, after the remaining part of the oxide film 41 is removed by, for example, hydrofluoric acid (HF), an oxide film 42 is newly deposited on the base front surface to have a thickness of, for example, about 1.5 µm to 2.5 µm. Next, the oxide film 42 is patterned by photolithography and etching to remove parts of the oxide film 42 corresponding to the gate trench 5. Next, after a resist mask (not depicted) used for patterning the oxide film 42 is removed, etching is performed using the remaining part of the oxide film 42 as a mask to form the gate trench 5. The depth d1 of the gate trench 5 may be, for example, about 0.5 µm to 5.0 µm. The width w1 of the gate trench 5 may be, for example, about 0.5 µm to 2.0 µm. The sequence in which the gate trench 5 and the contact trench 8 are formed may be interchanged. The state up to here is depicted in FIG. 8.

Figure 9:
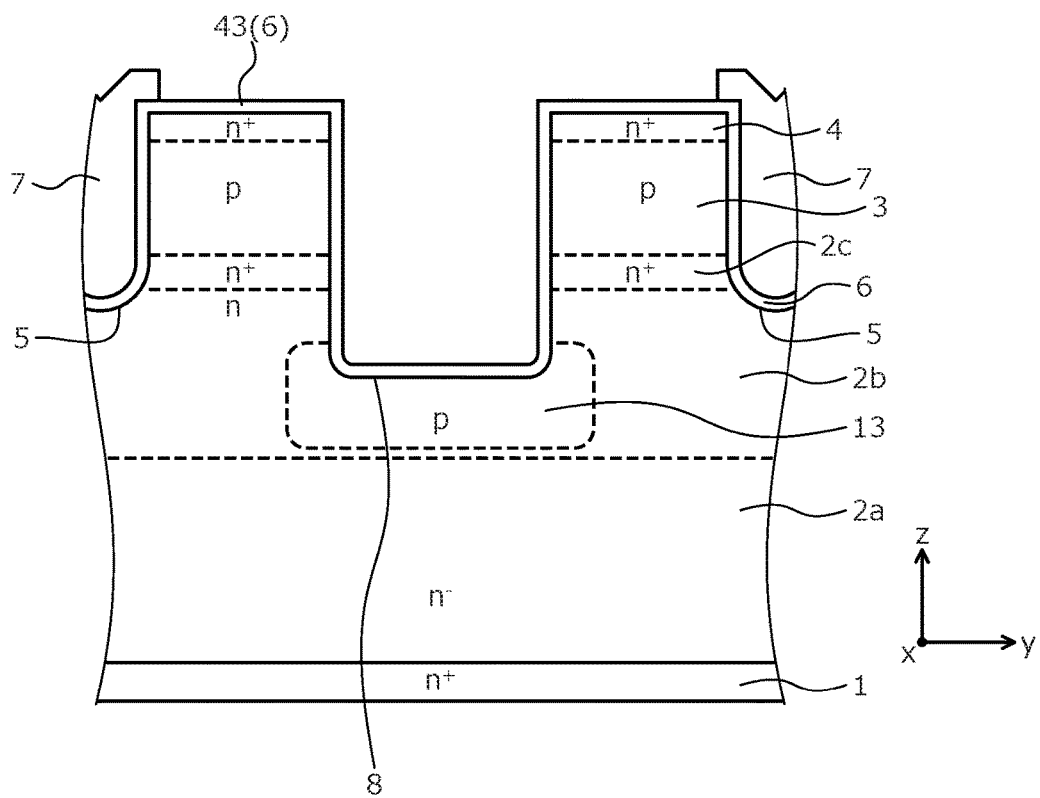

Next, after the remaining part of the oxide film 42 is removed, an oxide film ($SiO_2$ film) 43 constituting the gate insulating film 6 is deposited so as to have a thickness of, for example, about 10 nm to 500 nm along the inner walls of the gate trench 5, and heat treatment is performed in a nitrogen ($N_2$) atmosphere at a temperature of about 800 to 1200 degrees C. Next, for example, a poly-silicon (poly-Si) layer is deposited on the base front surface so as to be embedded in the gate trench 5, via the oxide film 43. A thickness of the poly-silicon layer is about 0.3 µm to 1.5 µm. Next, the poly-silicon layer is patterned by photolithography and etching, and the gate electrode 7 is formed. The state up to here is depicted in FIG. 9.

Next, on the base front surface, an oxide film is deposited as the interlayer insulating film 9 and, for example, has a thickness of about 0.5 µm to 1.5 µm. Next, the interlayer insulating film 9 is patterned by photolithography and etching, and the contact hole 9a is formed. Here, the interlayer insulating film 9 and the oxide film 43 are patterned, exposing the semiconductor regions. As a result, an opening (i.e., the contact hole 9a) of a resist film 44 used for patterning the interlayer insulating film 9 exposes at the base front surface and the inner walls of the contact trench 8, the n⁺-type source region 4, the p⁺-type contact region 14, the p-type base region 3, the third n⁺-type drift region 2c, the second n-type drift region 2b, and the p-type semiconductor region 13.

Figure 10:
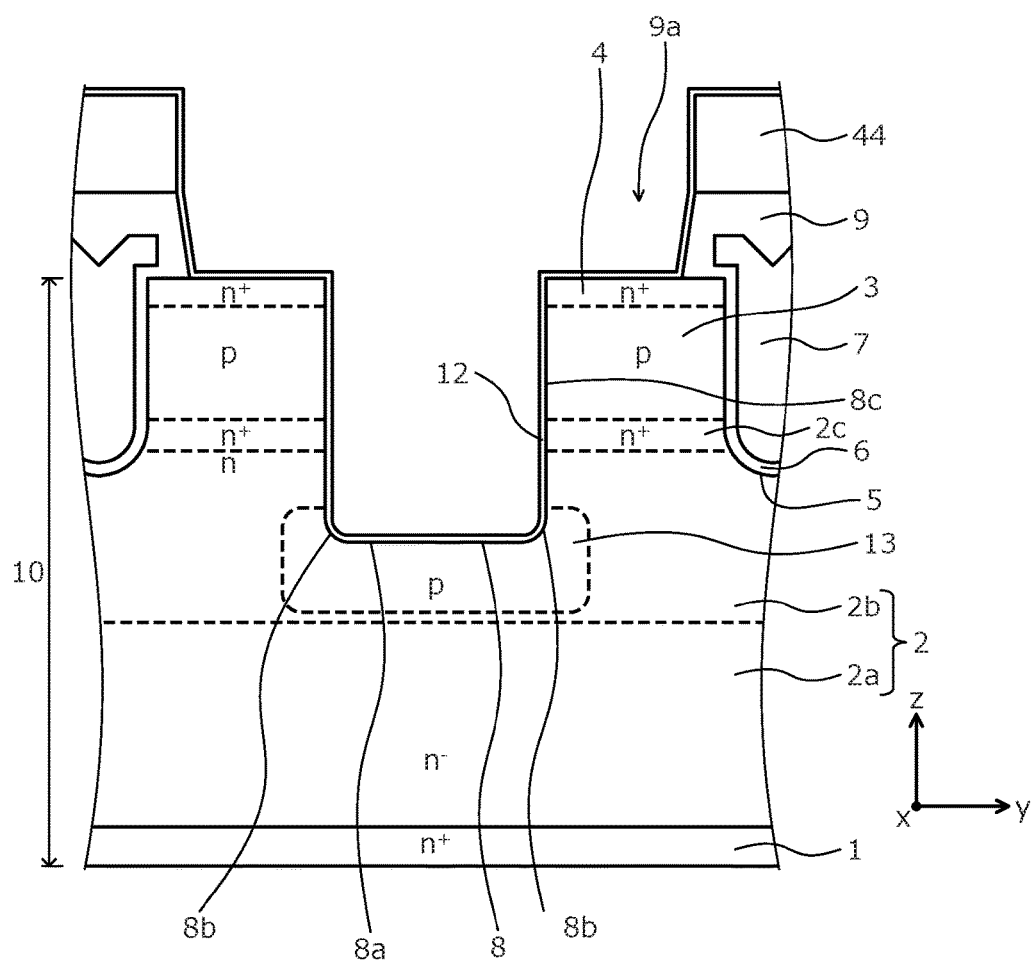

Next, with the resist film 44 used for patterning the interlayer insulating film 9 remaining in place, the metal film 12 is deposited (formed) along the inner walls of the contact trench 8 and the base front surface exposed by the opening of the resist film 44. The state up to here is depicted in FIG. 10. Next, the semiconductor base 10 subjected to the processes up to here is immersed in, for example, acetone, and a liftoff process of removing the resist film 44 and the metal film 12 on the resist film 44 is performed. Next, the source electrode 11 containing, for example, aluminum, is deposited (formed) on the base front surface so as to be embedded in the contact trench 8. Thereafter, the wafer is diced into individual chips whereby the trench-type SiC-MOSFET depicted in FIGS. 1 and 2 is completed.

In the method of manufacturing, although the third n⁺-type drift region 2c is formed in the surface of the second n-type drift region 2b by ion implantation, the n⁺-type drift region 2c may be formed by epitaxial growth. In particular, an n⁺-type epitaxial layer constituting the third n⁺-type drift region 2c is deposited (formed) by epitaxial growth on the surface of the second n-type drift region 2b.

As described, the third n⁺-type drift region having an impurity concentration higher than that of the second n-type drift region is provided between the second n-type drift region and the p-type base region. Here, at the n-type drift region that is the part between the p-type regions of the p-type base region and the p-type semiconductor region, parasitic resistance is easily generated and the resistance of the n-type drift region increases due to the parasitic resistance. The impurity concentration of the third n⁺-type drift region between the p-type regions is increased whereby the resistance of the n-type drift region may be reduced. As a result, when the parasitic Schottky diode is on, hole current is decreased and the parasitic pn diode may be prevented from turning on.

Further, since the resistance of the n-type drift region may be reduced, parasitic JFET resistance in the drift region and the p-type semiconductor region may also be reduced, enabling the ON resistance of the semiconductor device to be reduced.

Figure 11:
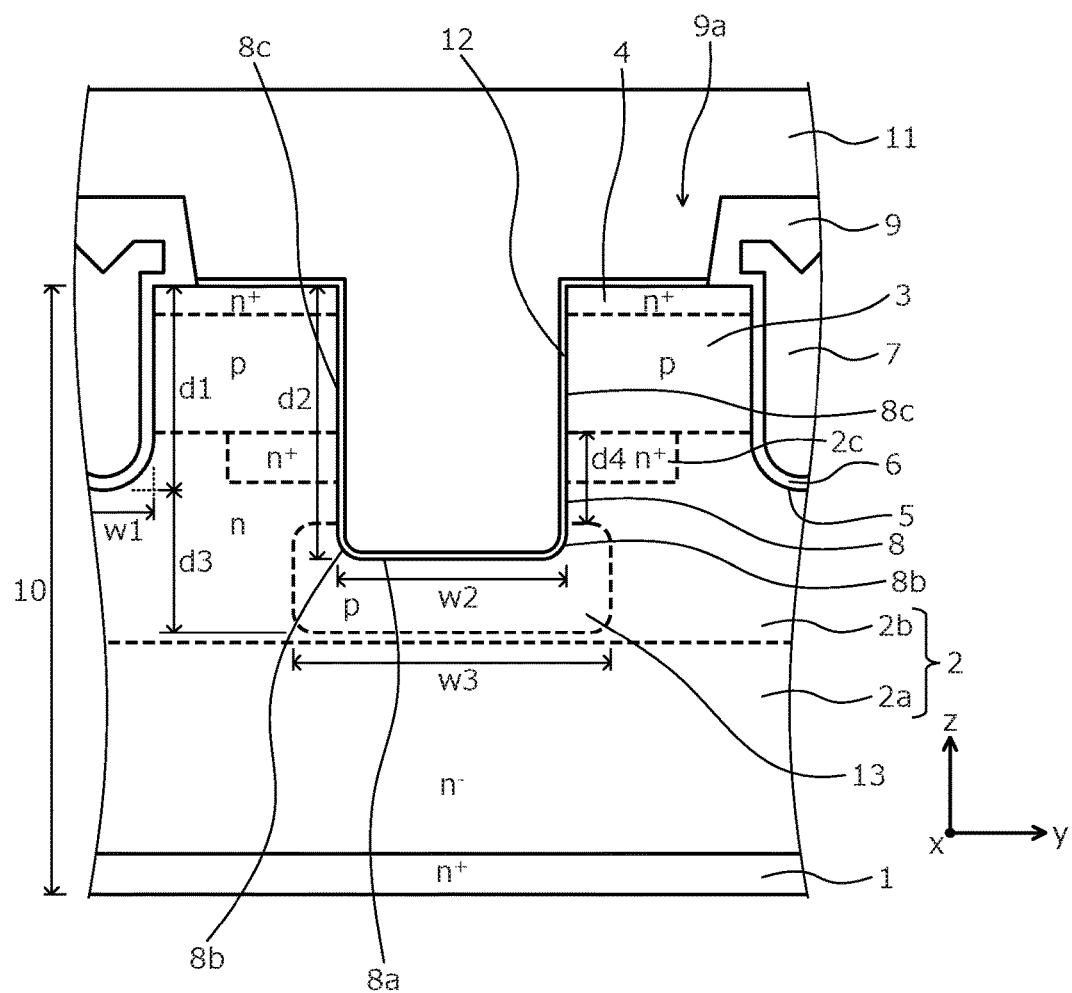
FIG. 11 is a cross-sectional view of a structure of the active region of the semiconductor device according to a second embodiment.

A structure of the semiconductor device according to a second embodiment will be described. FIG. 11 is a cross-sectional view of a structure of the active region of the semiconductor device according to the second embodiment. A planar layout near the contact trench 8 in FIG. 11 is similar to that of the first embodiment (refer to FIG. 2). The semiconductor device according to the second embodiment differs from the semiconductor device according to the first embodiment in the shape of the third n⁺-type drift region 2c. In the second embodiment, the third n⁺-type drift region 2c is selectively provided in the surface of the second n-type drift region 2b. The n⁺-type drift region 2c is in contact with the side wall 8c of the contact trench 8 and is not in contact with the side wall of the gate trench 5. In this manner, in the second embodiment, the size of the third n⁺-type drift region 2c may be reduced as compared to in the first embodiment.

Figure 12:
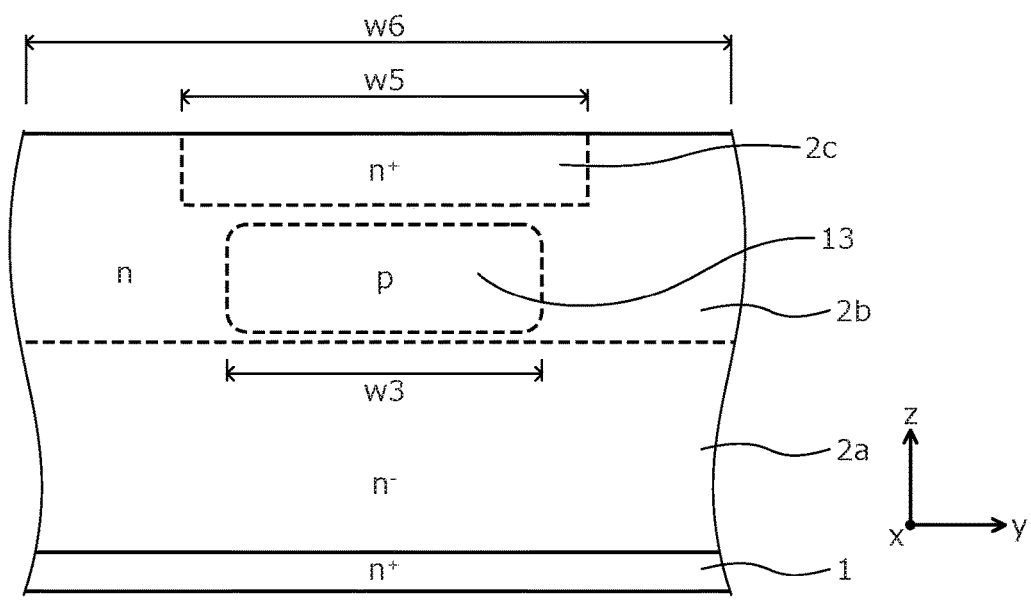
FIG. 12 is a cross-sectional view of the semiconductor device according to the second embodiment during manufacture.

The method of manufacturing a semiconductor device according to the second embodiment will be described taking as an example, a case in which a 3300V trench-type SiC-MOSFET is produced. FIG. 12 is a cross-sectional view of the semiconductor device according to the second embodiment during manufacture. The method of manufacturing a semiconductor device according to the second embodiment, for example, includes in the method of manufacturing a semiconductor device according to the first embodiment, selectively forming the third n⁺-type drift region 2c in the surface of the second n-type drift region 2b. In particular, first, similar to the first embodiment, on the front surface of a silicon carbide substrate (semiconductor wafer) constituting the n⁺-type drain layer 1, the first n⁻-type drift region 2a is formed by epitaxial growth and in the surface layer of the first n⁻-type drift region 2a, the second n-type drift region 2b is formed by photolithography and ion implantation.

Next, similar to the first embodiment, the p-type semiconductor region 13 is selectively formed in the surface layer of the second n-type drift region 2b by photolithography and ion implantation. The width w3 of the p-type semiconductor region 13 may be the same as in the first embodiment.

Next, similar to the first embodiment, an n-type epitaxial layer is formed by epitaxial growth so as to cover the p-type semiconductor region 13 whereby the thickness of the second n-type drift region 2b is increased. Next, the third n⁺-type drift region 2c is selectively formed in the surface layer of the second n-type drift region 2b by photolithography and ion implantation of an n-type impurity such as phosphorus or nitrogen. Here, a mask used in the photolithography is adjusted so that the third n⁺-type drift region 2c is not formed in the entire surface of the second n-type drift region 2b. In particular, a width w5 of the third n⁺-type drift region 2c is greater than the width w3 of the p-type semiconductor region 13 and less than a width w6 between gate trenches. The impurity concentration of the third n⁺-type drift region 2c may be, for example, about $1\times10^{18}/cm^3$ to $1\times10^{20}/cm^3$. The state up to here is depicted in FIG. 12.

Thereafter, the p-type base region 3 is formed and subsequent processes are sequentially performed similar to the first embodiment whereby the trench-type SiC-MOSFET depicted in FIG. 11 is completed.

As described, according to the second embodiment, effects similar to those of the first embodiment may be obtained. Further, according to the second embodiment, the third n⁺-type drift region is not in contact with the gate trench. Therefore, the impurity concentration of the n-type drift region in contact with the gate trench is reduced, enabling characteristics of the semiconductor device to be improved.

Figure 13:
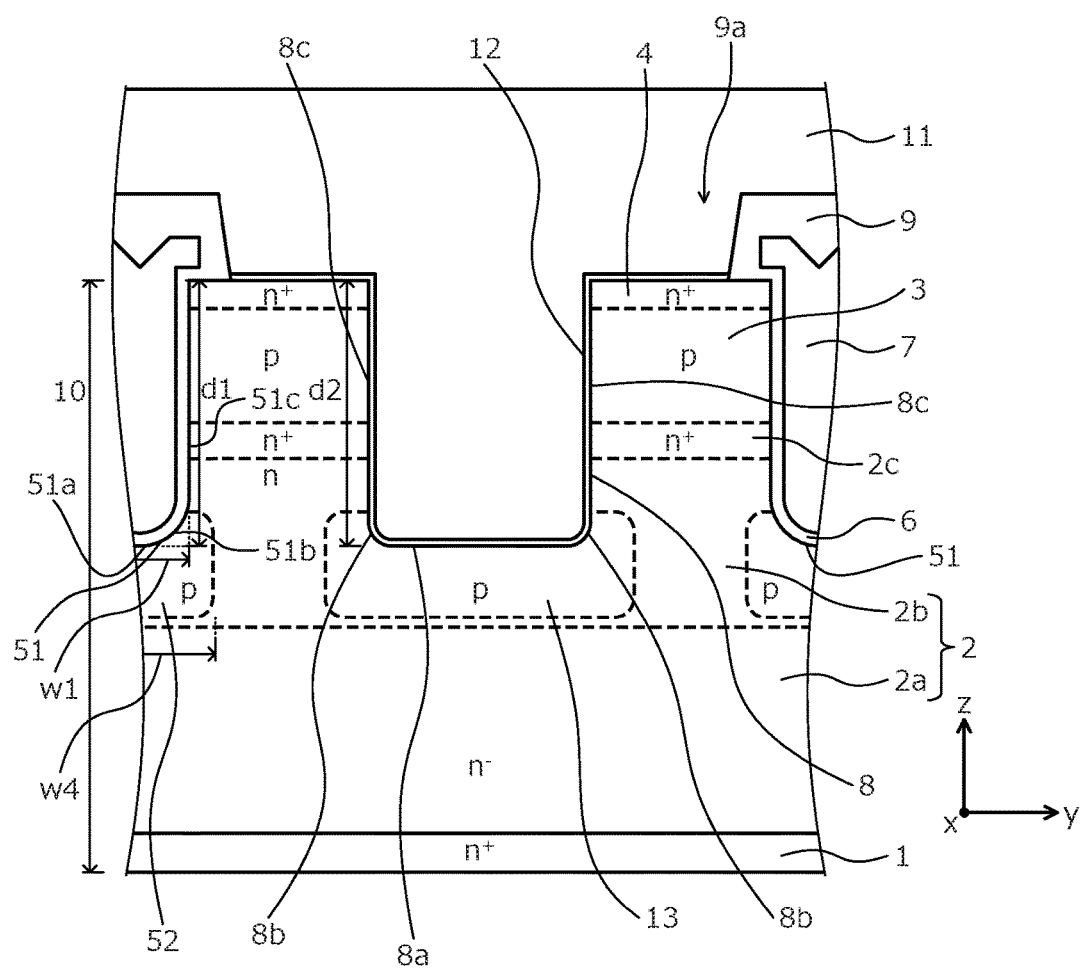
FIG. 13 is a cross-sectional view of a structure of the active region of the semiconductor device according to a third embodiment.

A structure of the semiconductor device according to a third embodiment will be described. FIG. 13 is a cross-sectional view of a structure of the active region of the semiconductor device according to the third embodiment. A planar layout near the contact trench 8 in FIG. 13 is similar to that of the first embodiment (refer to FIG. 2). The semiconductor device according to the third embodiment differs from the semiconductor device according to the first embodiment in that a p-type semiconductor region (hereinafter, second p-type semiconductor region (fourth semiconductor region)) 52 is provided so as to cover the gate electrode at the entire surface at a bottom 51a and corners 51b of a gate trench 51, via the gate insulating film 6.

The second p-type semiconductor region 52 is provided in the second n-type drift region 2b, separated from the p-type semiconductor region 13 at the bottom 8a of the contact trench 8. A width w4 of the second p-type semiconductor region 52 is wider than the width w1 of the gate trench 51 (w4>w1). The second p-type semiconductor region 52 is provided in this manner, enabling the electric field applied to the gate insulating film 6 at the bottom 51a of the gate trench 51 to be mitigated. As a result, the electric field applied to the gate insulating film 6 may be mitigated without making the distance (reference character d3 in FIG. 1) from the bottom 51a of the gate trench 51 to the bottom surface of the p-type semiconductor region 13 a predetermined range or more. Therefore, the depth d2 of the contact trench 8 may the depth d1 of the gate trench 51 or less (d2≤d1).

The method of manufacturing a semiconductor device according to the third embodiment will be described taking as an example, a case in which a 3300V trench-type SiC-MOSFET is produced. FIGS. 14, 15, 16, 17, and 18 are cross-sectional views of the semiconductor device according to the third embodiment during manufacture. The method of manufacturing a semiconductor device according to the third embodiment, for example, includes in the method of manufacturing a semiconductor device according to the first embodiment, forming the second p-type semiconductor region 52 together with the p-type semiconductor region 13 when the p-type semiconductor region 13 is formed. In particular, first, similar to the first embodiment, on the front surface of a silicon carbide substrate (semiconductor wafer) constituting the n⁺-type drain layer 1, the first n⁻-type drift region 2a is formed by epitaxial growth, and the second n-type drift region 2b is formed in the surface layer of the first n⁻-type drift region 2a by photolithography and ion implantation.

Figure 14:
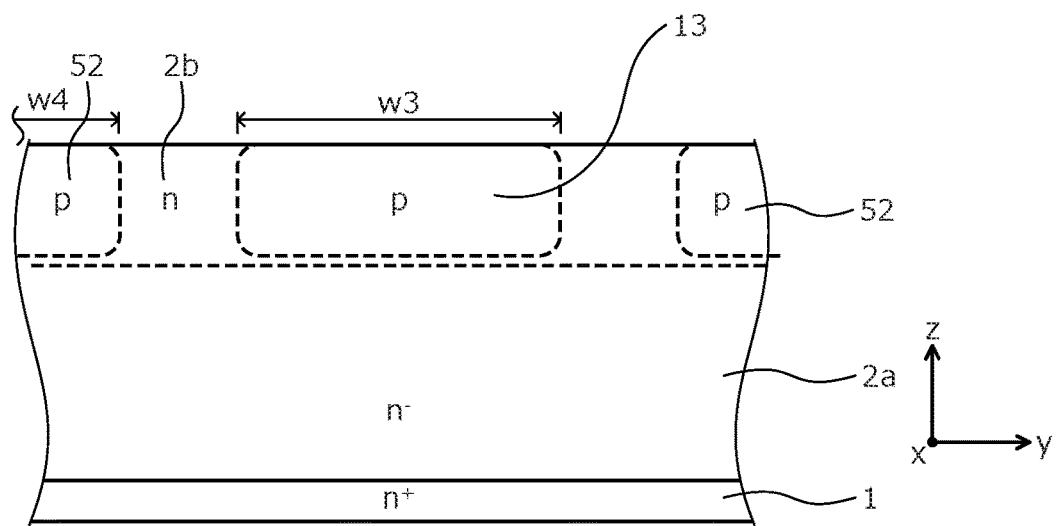
FIGS. 14, 15, 16, 17, and 18 are cross-sectional views of the semiconductor device according to the third embodiment during manufacture.

Next, similar to the first embodiment, the p-type semiconductor region 13 is selectively formed in the surface layer of the second n-type drift region 2b by photolithography and ion implantation. At this time, the second p-type semiconductor region 52 is selectively formed in the surface layer of the second n-type drift region 2b together with the p-type semiconductor region 13. The second p-type semiconductor region 52 is formed so as to be separated from the p-type semiconductor region 13. The width w3 of the p-type semiconductor region 13 may be the same as in the first embodiment. The width w4 of the second p-type semiconductor region 52 may be, for example, about 0.3 μm to 2.0 μm. The state up to here is depicted in FIG. 14.

Figure 15:
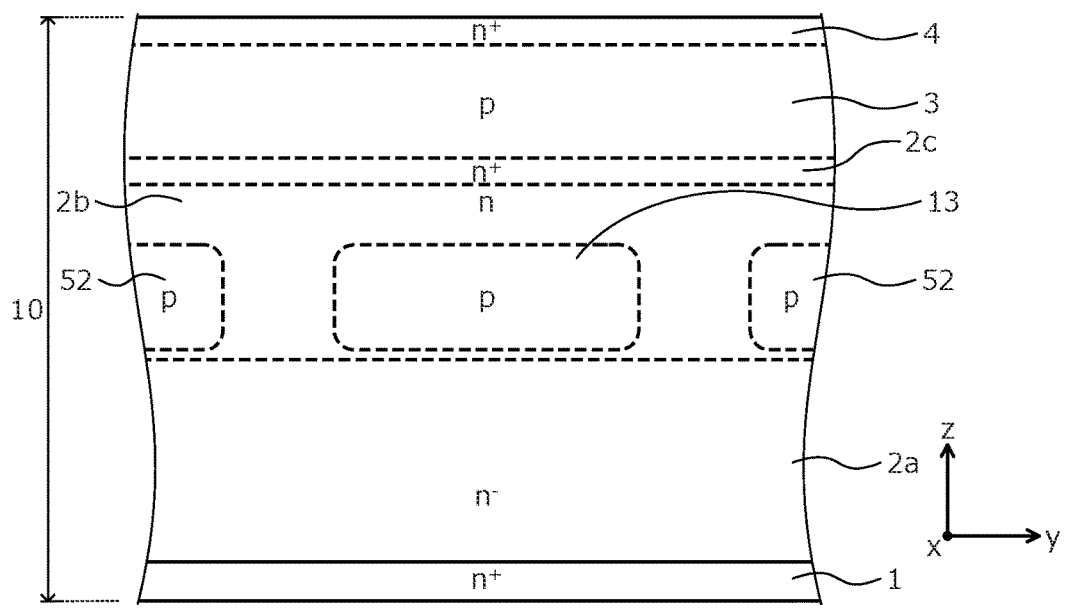

Next, similar to the first embodiment, an n-type epitaxial layer is formed by epitaxial growth so as to cover the p-type semiconductor region 13 and the second p-type semiconductor region 52 whereby the thickness of the second n-type drift region 2b is increased. Next, similar to the first embodiment, the third n⁺-type drift region 2c is selectively formed in the surface layer of the second n-type drift region 2b by photolithography and ion implantation of an n-type impurity. Next, similar to the first embodiment, the p-type base region 3 is formed by epitaxial growth on the third n⁺-type drift region 2c, producing the semiconductor base (silicon carbide epitaxial wafer) 10. Photolithography and ion implantation are repeatedly performed similar to the first embodiment whereby the n⁺-type source region 4 and the p⁺-type contact region 14 are sequentially and selectively formed in the surface layer of the p-type base region 3. The state up to here is depicted in FIG. 15.

Figure 16:
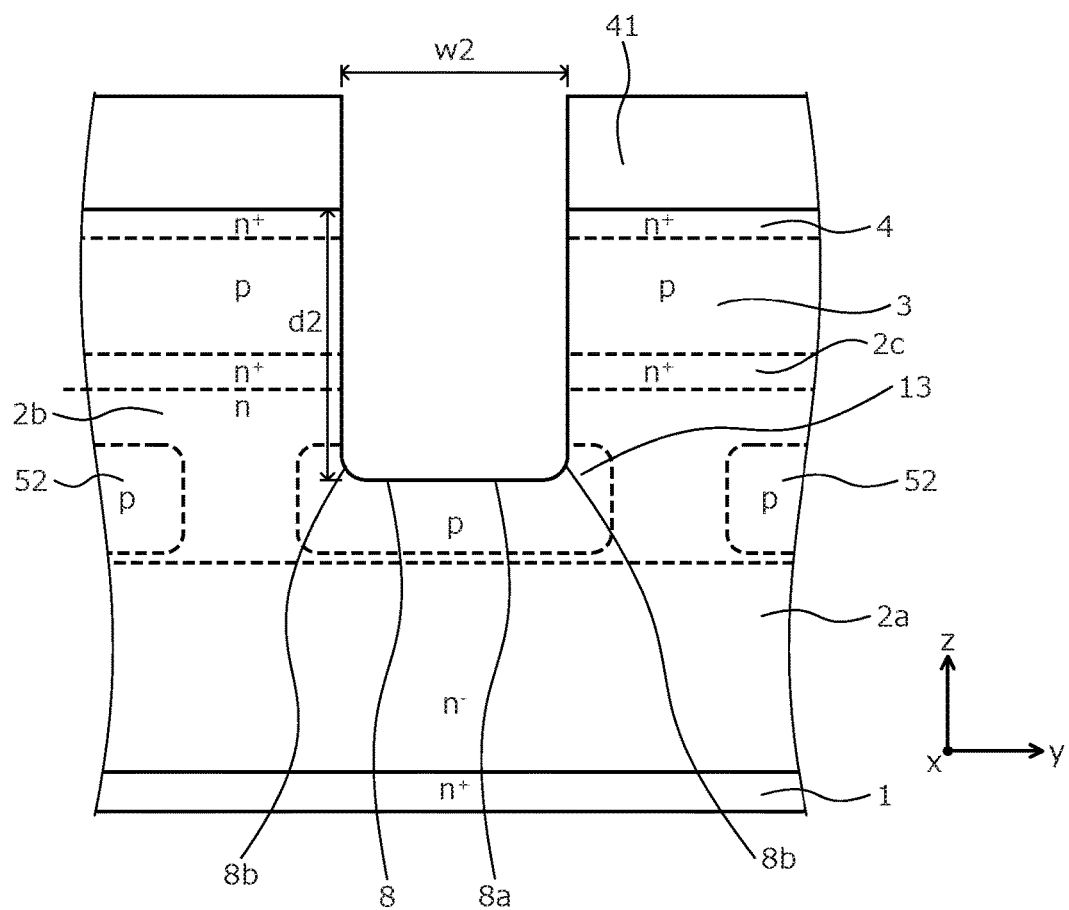
Figure 17:
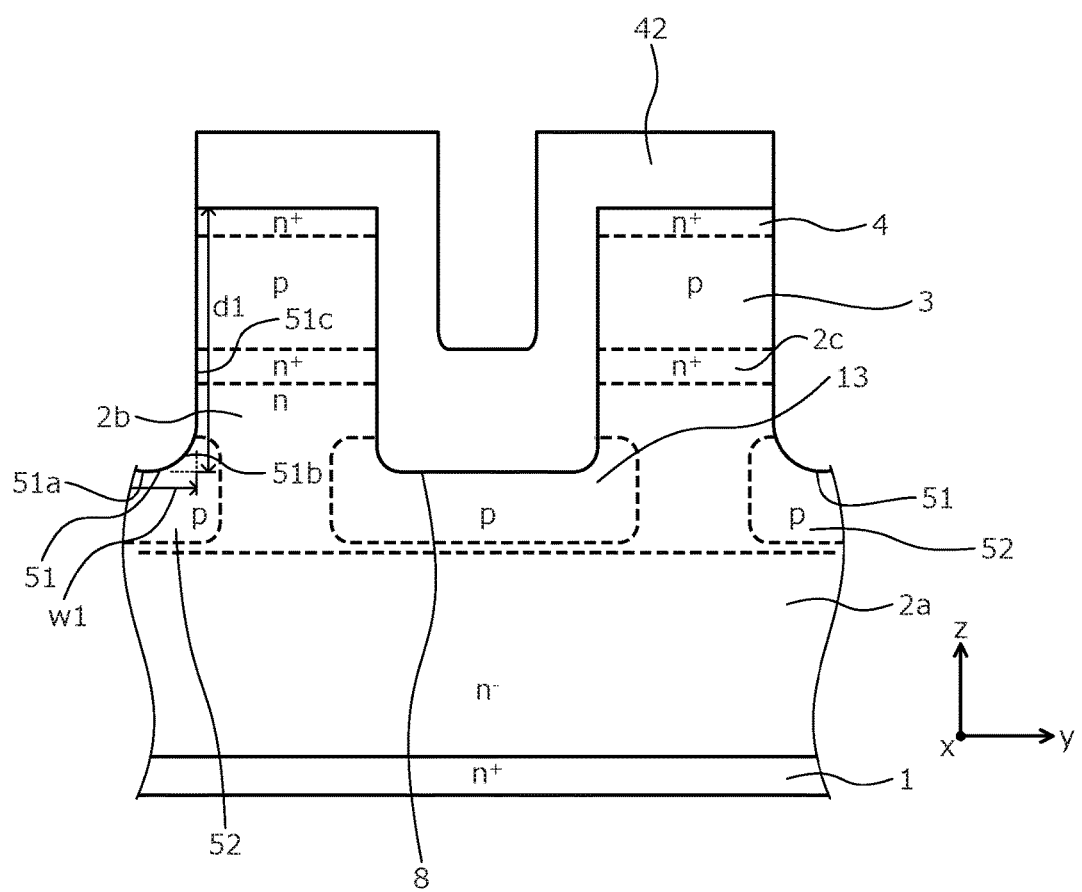
Figure 18:
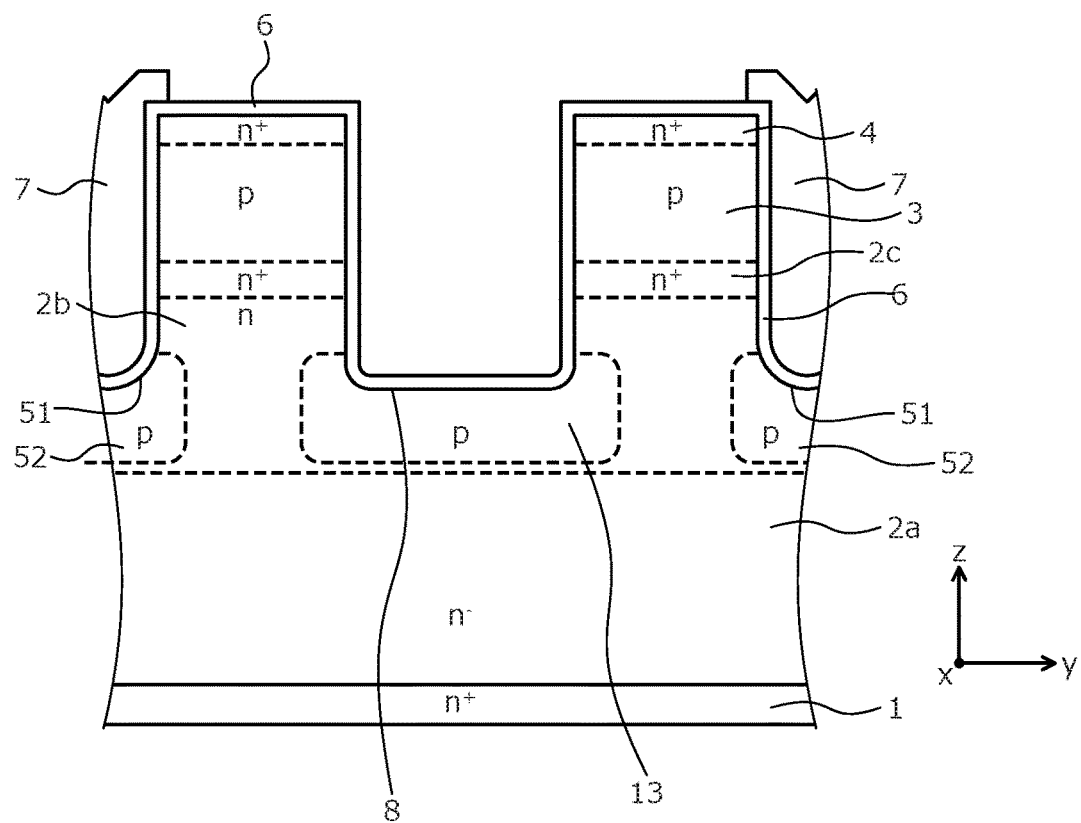

Next, similar to the first embodiment, etching is performed using the remaining part of the oxide film 41 as a mask to form the contact trench 8 so that the bottom 8a and the corners 8b reach the p-type semiconductor region 13 at the depth d2. The state up to here is depicted in FIG. 16. Next, after the remaining part of the oxide film 41 is removed by, for example, hydrofluoric acid (HF), similar to the first embodiment, etching is performed using the remaining part of the oxide film 42 to form the gate trench 51. At this time, the gate trench 51 is formed so that the bottom 51a and the corners 51b reach the second p-type semiconductor region 52 at the depth d1. Here, a case is depicted where the depth d1 of the gate trench 51 is substantially the same as the depth d2 of the contact trench 8. The state up to here is depicted in FIG. 17.

The depth d2 of the contact trench 8 may be the depth d1 of the gate trench 51 or less, and may be set to be within the same range as in the first embodiment. The width w2 of the contact trench 8 may be, for example, the same as in the first embodiment. The depth d1 of the gate trench 51 may be set to be within the same range as in the first embodiment. The width w1 of the gate trench 51 may be the same as the width w1 in the first embodiment. The sequence in which the gate trench 51 and the contact trench 8 are formed may be interchanged. Further, when the depth d1 of the gate trench 51 and the depth d2 of the contact trench 8 are the same, the gate trench 51 and the contact trench 8 may be formed using the same etching mask.

Next, similar to the first embodiment, after the oxide film 43 constituting the gate insulating film 6 is formed, a gate poly-silicon layer constituting the gate electrode 7 is deposited and patterned. The state up to here is depicted in FIG. 16. Thereafter, the interlayer insulating film 9 is formed and subsequent processes are sequentially performed similar to the first embodiment whereby the trench-type SiC-MOSFET depicted in FIG. 11 is completed. Further, similar to the first embodiment, the third $n^+$-type drift region $2c$ may be formed on the surface of the second n-type drift region $2b$ by epitaxial growth.

As described, according to the third embodiment, effects similar to those of the first embodiment may be obtained. Further, according to the third embodiment, the second p-type semiconductor region is provided so as to cover the gate electrode at the entire surface at the corners and the bottom of the gate trench, via the gate insulating film whereby the electric field applied to the gate insulating film at the bottom of the gate trench may be mitigated.

Figure 19:
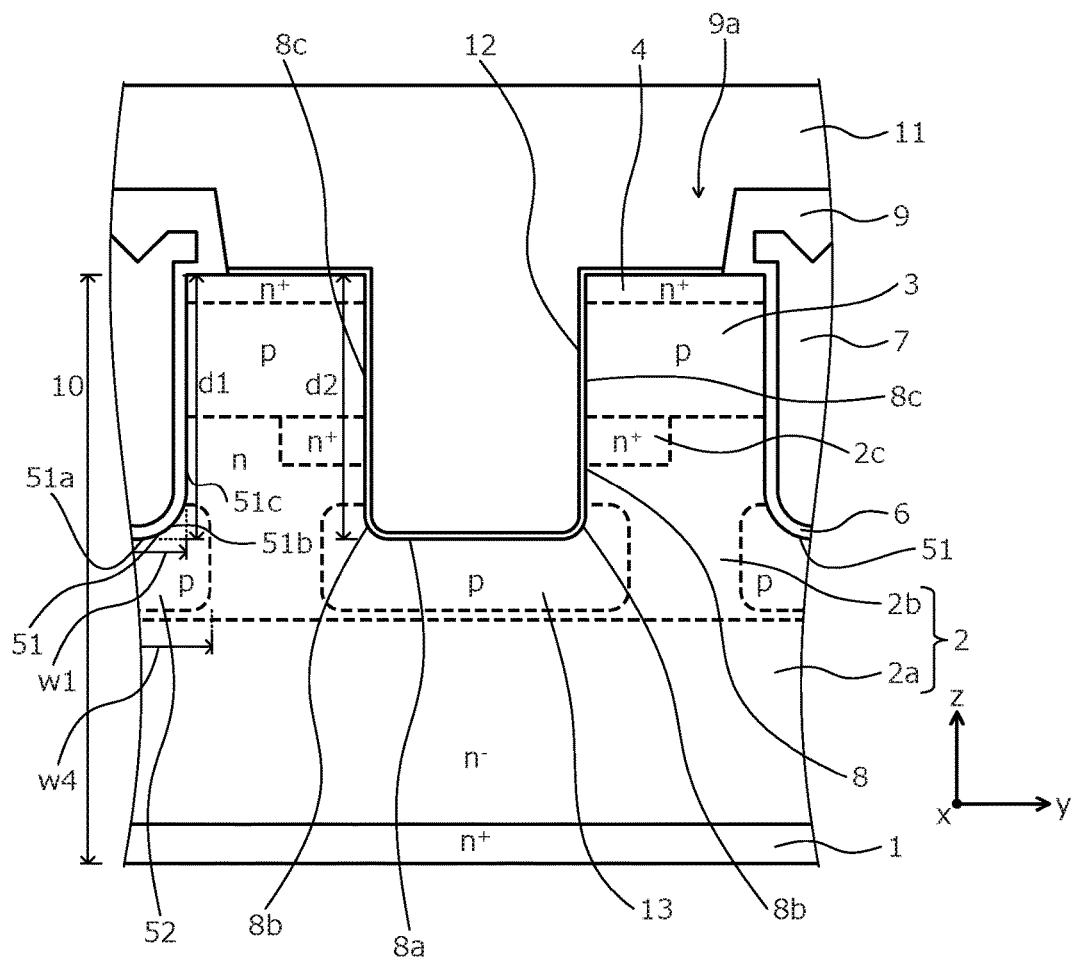
FIG. 19 is a cross-sectional view of a structure of the active region of the semiconductor device according to a fourth embodiment.

A structure of the semiconductor device according to a fourth embodiment will be described. FIG. 19 is a cross-sectional view of a structure of the active region of the semiconductor device according to the fourth embodiment. A planar layout near the contact trench 8 in FIG. 19 is similar to that of the first embodiment (refer to FIG. 2). The semiconductor device according to the fourth embodiment differs from the semiconductor device according to the third embodiment in the formation of the third $n^+$-type drift region $2c$. In the fourth embodiment, the third $n^+$-type drift region $2c$ is selectively formed in the surface of the second n-type drift region $2b$ so as to be in contact with the side wall $8c$ of the contact trench 8 and not in contact with the side wall of the gate trench 51. In this manner, in the fourth embodiment, the size of the third $n^+$-type drift region $2c$ is smaller than the size thereof in the third embodiment.

Figure 20:
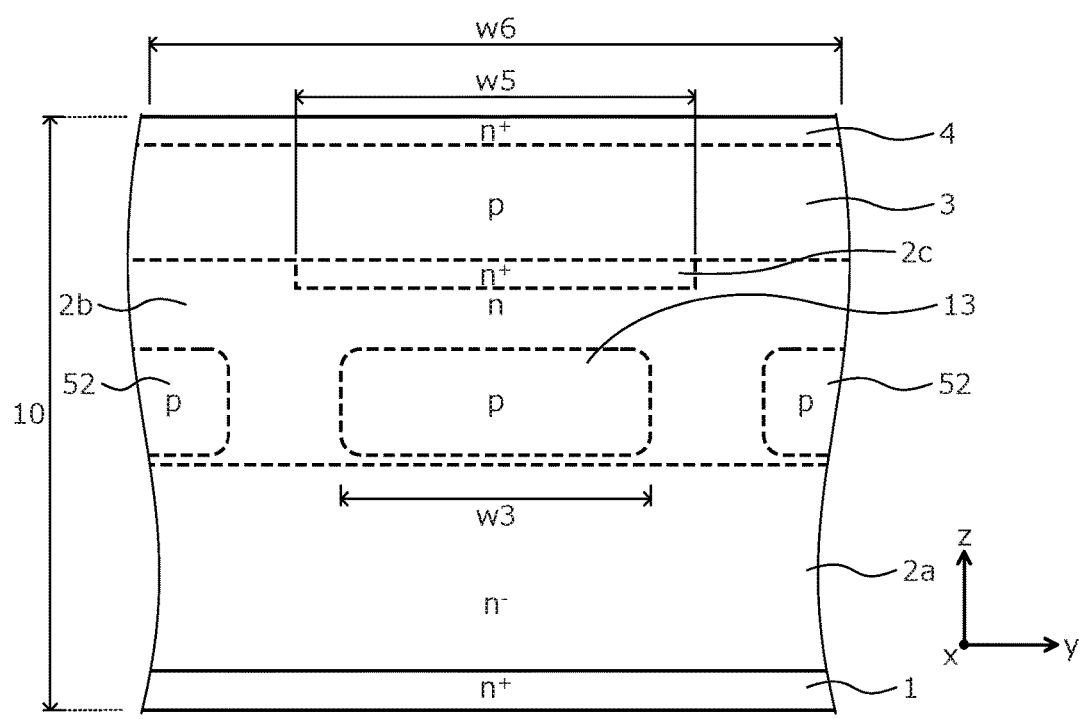
FIG. 20 is a cross-sectional view of the semiconductor device according to the fourth embodiment during manufacture.

The method of manufacturing a semiconductor device according to the fourth embodiment will be described taking as an example, a case where a 3300V trench-type SiC-MOSFET is produced. FIG. 20 is a cross-sectional view of the semiconductor device according to the fourth embodiment during manufacture. The method of manufacturing a semiconductor device according to the fourth embodiment, for example, includes in the method of manufacturing a semiconductor device according to the third embodiment, selectively forming the third $n^+$-type drift region $2c$ in the surface of the second n-type drift region $2b$. In particular, first, similar to the third embodiment, on the front surface of a silicon carbide substrate (semiconductor wafer) constituting the $n^+$-type drain layer 1, the first $n^-$-type drift region $2a$ is formed by epitaxial growth and in the surface layer of the first $n^-$-type drift region $2a$, the second n-type drift region $2b$ is formed by photolithography and ion implantation.

Next, similar to the third embodiment, the p-type semiconductor region 13 and the second p-type semiconductor region 52 are selectively formed in the surface layer of the second n-type drift region $2b$ by photolithography and ion implantation. The width w3 of the p-type semiconductor region 13 and the width w4 of the second p-type semiconductor region 52 may be the same as in the third embodiment.

Next, similar to the third embodiment, an n-type epitaxial layer is formed by epitaxial growth so as to cover the p-type semiconductor region 13 whereby the thickness of the second n-type drift region $2b$ is increased. Next, the third $n^+$-type drift region $2c$ is selectively formed in the surface layer of the second n-type drift region $2b$ by photolithography and ion implantation of an n-type impurity. Here, a mask used in the photolithography is adjusted so that the third $n^+$-type drift region $2c$ is not formed in the entire surface of the second n-type drift region $2b$. In particular, the width w5 of the third $n^+$-type drift region $2c$ is greater than the width w3 of the p-type semiconductor region 13 and less than the width w6 between gate trenches. Next, similar to the third embodiment, the p-type base region 3 is formed on the third $n^+$-type drift region $2c$ by epitaxial growth, producing the semiconductor base (silicon carbide epitaxial wafer) 10. Photolithography and ion implantation are repeatedly performed similar to the third embodiment whereby the $n^+$-type source region 4 and the $p^+$-type contact region 14 are sequentially and selectively formed in the surface layer of the p-type base region 3. The state up to here is depicted in FIG. 20.

Thereafter, the contact trench 8 is formed and subsequent processes are sequentially performed similar to the first embodiment whereby the trench-type SiC-MOSFET depicted in FIG. 15 is completed.

As described, according to the fourth embodiment, effects similar to those of the first embodiment may be obtained. Further, according to the fourth embodiment, since the third $n^+$-type drift region $2c$ is not in contact with the gate trench 51, effects similar to those of the second embodiment may be obtained. Further, according to the fourth embodiment, since the second p-type semiconductor region is provided, effects similar to those of the third embodiment may be obtained.

Figure 21:
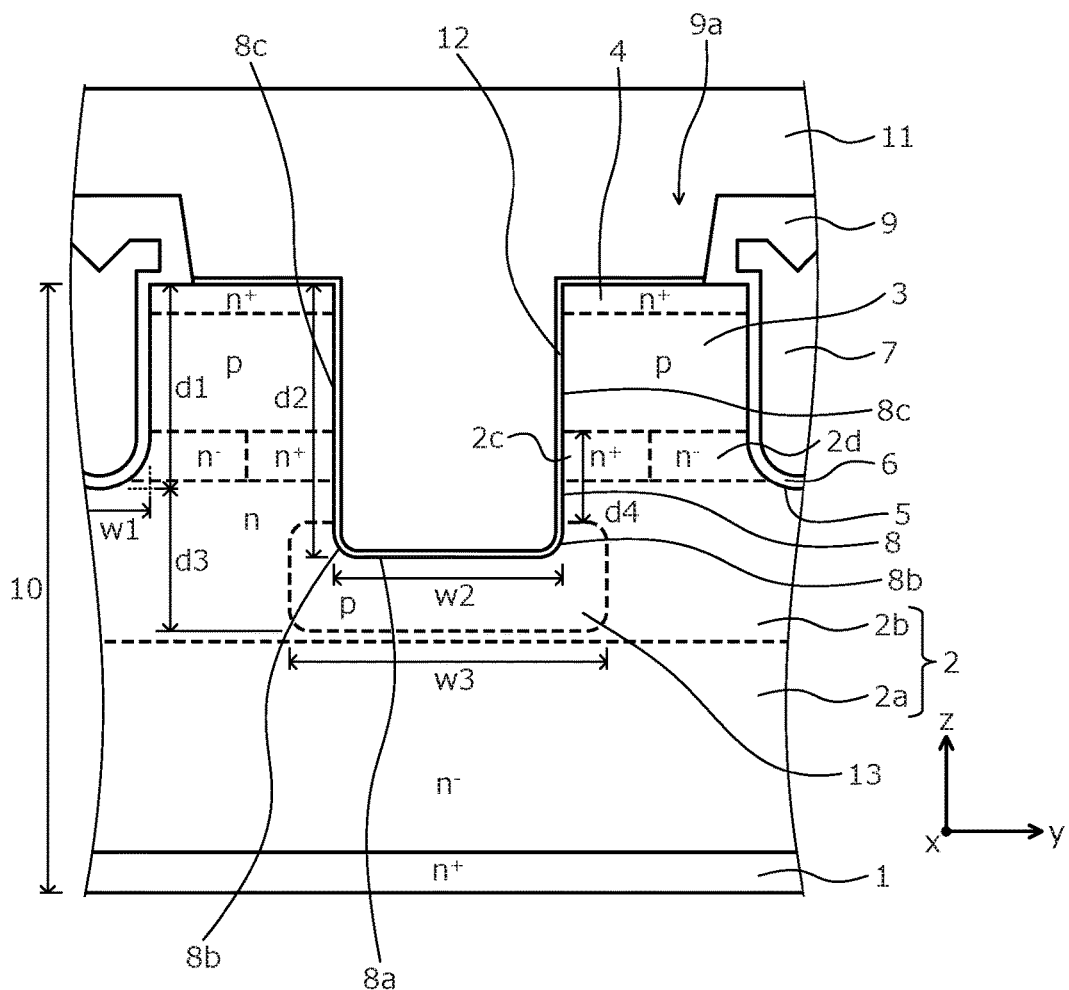
FIG. 21 is a cross-sectional view of a structure of the active region of the semiconductor device according to a fifth embodiment.

A structure of the semiconductor device according to a fifth embodiment will be described. FIG. 21 is a cross-sectional view of a structure of the active region of the semiconductor device according to the fifth embodiment. A planar layout near the contact trench 8 in FIG. 21 is similar to that of the first embodiment (refer to FIG. 2). The semiconductor device according to the fifth embodiment differs from the semiconductor device according to the first embodiment in the formation of the third $n^+$-type drift region $2c$ and further differs in that an $n^-$-type region (second silicon carbide semiconductor region) (hereinafter, fourth $n^-$-type drift region) $2d$ is provided on the side of the third $n^+$-type drift region $2c$ facing the gate trench 5. The third $n^+$-type drift region $2c$ is selectively formed in the surface of the second n-type drift region $2b$; a first side of the third $n^+$-type drift region $2c$ is in contact with the side wall $8c$ of the contact trench 8; and a second side of the third $n^+$-type drift region $2c$ (the second side is opposite the first side) is in contact with the fourth $n^-$-type drift region $2d$. A first side of the fourth $n^-$-type drift region $2d$ is in contact with the side wall of the gate trench 5 and a second side of the fourth $n^-$-type drift region $2d$ (the second side faces toward the contact trench 8) is in contact with the third n+-type drift region 2c. Further, a film thickness of the fourth n−-type drift region 2d is about the same as that of the third n+-type drift region 2c; a third side of the fourth n−-type drift region 2d (the third side faces toward the source electrode 11) is in contact with the p-type base region 3; and a fourth side of the fourth n−-type drift region 2d (the fourth side faces toward the n+-type drain layer 1) is in contact with the second n-type drift region 2b.

Figure 22:
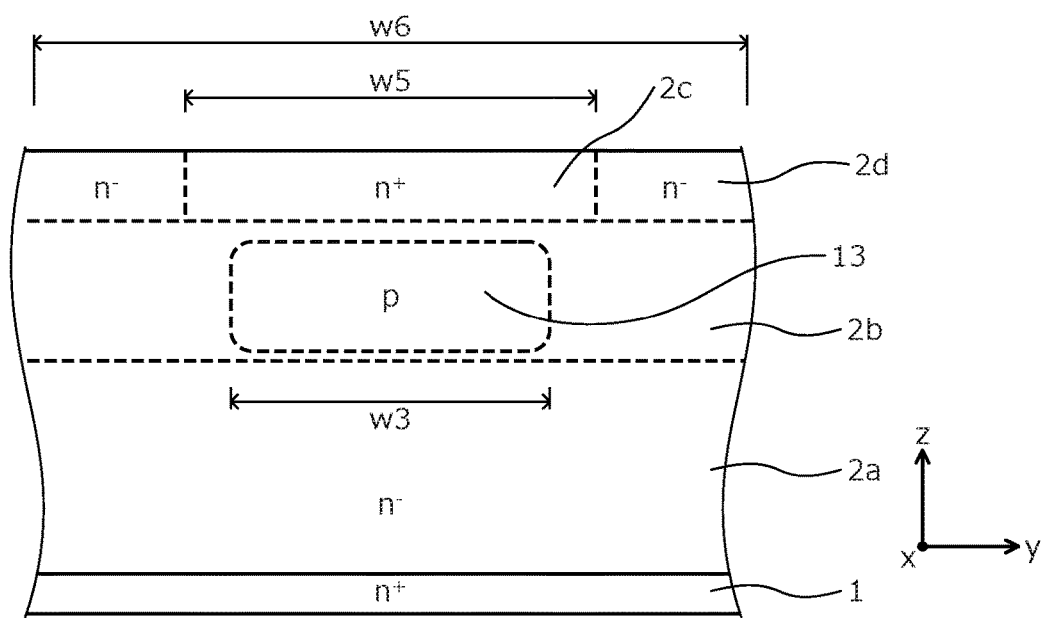
FIG. 22 is a cross-sectional view of the semiconductor device according to the fifth embodiment during manufacture.

The method of manufacturing a semiconductor device according to the fifth embodiment will be described taking as an example a case where a 3300V trench-type SiC-MOSFET is produced. FIG. 22 is a cross-sectional view of the semiconductor device according to the fifth embodiment during manufacture. The method of manufacturing a semiconductor device according to the fifth embodiment, for example, includes in the method of manufacturing a semiconductor device according to the first embodiment, selectively forming the third n+-type drift region 2c and the fourth n−-type drift region 2d in the surface of the second n-type drift region 2b. In particular, first, similar to the first embodiment, on the front surface of a silicon carbide substrate (semiconductor wafer) constituting the n+-type drain layer 1, the first n−-type drift region 2a is formed by epitaxial growth, and the second n-type drift region 2b is formed in the surface layer of the first n−-type drift region 2a by photolithography and ion implantation.

Next, similar to the first embodiment, the p-type semiconductor region 13 is selectively formed in the surface layer of the second n-type drift region 2b by photolithography and ion implantation. The width w3 of the p-type semiconductor region 13 may be the same as in the first embodiment.

Next, similar to the first embodiment, an n-type epitaxial layer is formed by epitaxial growth so as to cover the p-type semiconductor region 13 whereby the thickness of the second n-type drift region 2b is increased. Next, an n−-type epitaxial layer constituting the third n+-type drift region 2c and the fourth n−-type drift region 2d is formed by epitaxial growth so as to cover the second n-type drift region 2b. Next, the third n+-type drift region 2c is selectively formed in the surface layer of the n−-type epitaxial layer by photolithography and ion implantation of an n-type impurity. Here, a mask used in the photolithography is adjusted so that the third n+-type drift region 2c is not formed in the entire surface of the n−-type epitaxial layer. In particular, the width w5 of the third n+-type drift region 2c is greater than the width w3 of the p-type semiconductor region 13 and less than the width w6 between gate trenches. Thus, the third n+-type drift region 2c and the fourth n−-type drift region 2d are formed in the surface of the second n-type drift region 2b. The state up to here is depicted in FIG. 22.

Thereafter, the p-type base region 3 is formed and subsequent processes are sequentially performed similar to the first embodiment whereby the trench-type SiC-MOSFET depicted in FIG. 21 is completed.

As described, according to the fifth embodiment, effects similar to those of the first embodiment may be obtained. Further, according to the fifth embodiment, the fourth n−-type drift region 2d having an impurity concentration that is lower than that of the first n−-type drift region 2a is in contact with the gate trench 5. Therefore, the impurity concentration of the n-type drift region in contact with the gate trench 5 may be lower than that in the first to fourth embodiments and semiconductor device characteristics may be improved further relative to the first to fourth embodiments.

Figure 23:
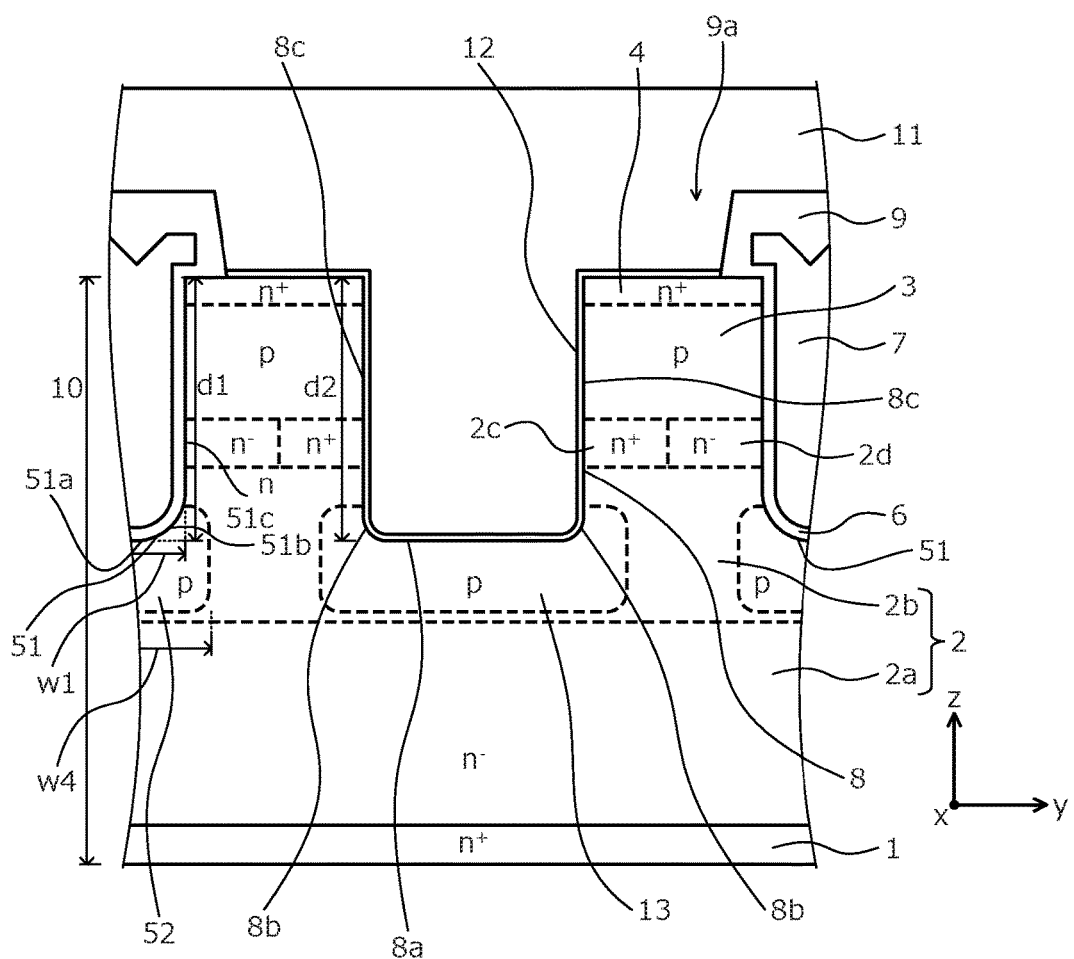
FIG. 23 is a cross-sectional view of a structure of the active region of the semiconductor device according to a sixth embodiment.

A structure of the semiconductor device according to a sixth embodiment will be described. FIG. 23 is a cross-sectional view of a structure of the active region of the semiconductor device according to the sixth embodiment. A planar layout near the contact trench 8 in FIG. 23 is similar to that of the first embodiment (refer to FIG. 2). The semiconductor device according to the sixth embodiment differs from the semiconductor device according to the third embodiment in the formation of the third n+-type drift region 2c and further differs in that the fourth n−-type drift region 2d is provided on the second side of the third n+-type drift region 2c. The third n+-type drift region 2c is selectively provided in the surface of the second n-type drift region 2b; the first side of the third n+-type drift region 2c is in contact with the side wall 8c of the contact trench 8; and the second side of the third n+-type drift region 2c is in contact with the fourth n−-type drift region 2d. The first side of the fourth n−-type drift region 2d is in contact with the side wall of the gate trench 5 and a second side of the fourth n−-type drift region 2d is in contact with the third n+-type drift region 2c. Further, the film thickness of the fourth n−-type drift region 2d is about the same as that of the third n+-type drift region 2c; the third side of the fourth n−-type drift region 2d is in contact with the p-type base region 3; and the fourth side of the fourth n−-type drift region 2d is in contact with the second n-type drift region 2b.

Figure 24:
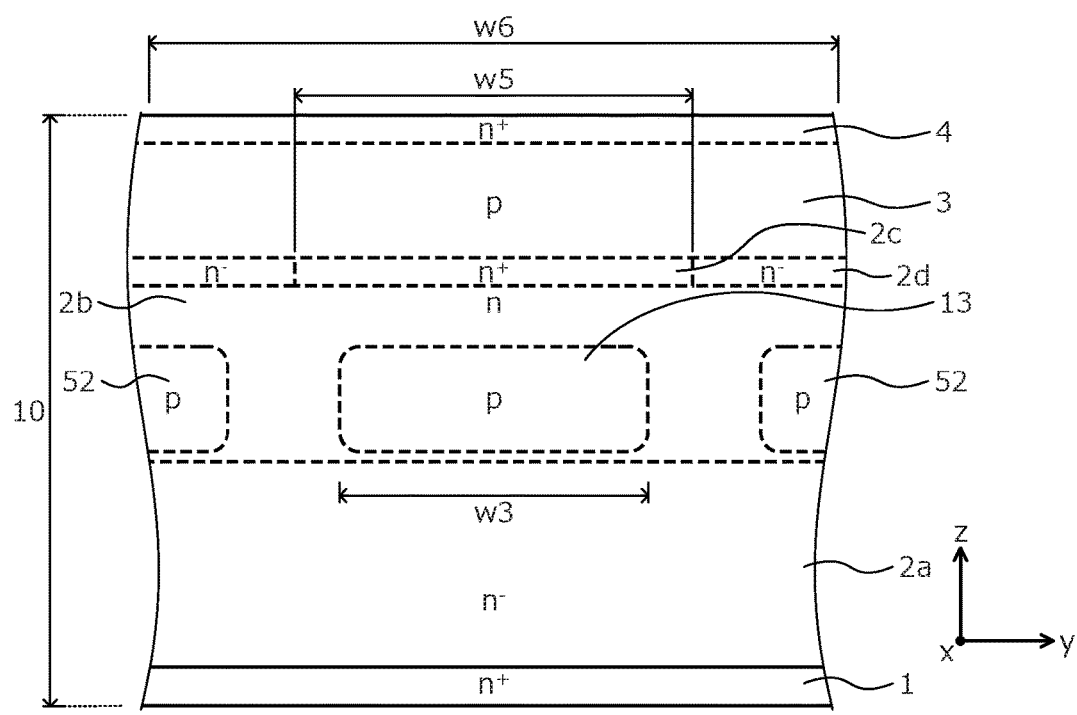
FIG. 24 is a cross-sectional view of the semiconductor device according to the fourth embodiment during manufacture.

The method of manufacturing a semiconductor device according to the sixth embodiment will be described taking as an example, a case where a 3300V trench-type SiC-MOSFET is produced. FIG. 24 is a cross-sectional view of the semiconductor device according to the fourth embodiment during manufacture. The method of manufacturing a semiconductor device according to the sixth embodiment, for example, includes in the method of manufacturing a semiconductor device according to the third embodiment, selectively forming the third n+-type drift region 2c and the fourth n−-type drift region 2d in the surface of the second n-type drift region 2b. In particular, first, similar to the third embodiment, on the front surface of a silicon carbide substrate (semiconductor wafer) constituting the n+-type drain layer 1, the first n−-type drift region 2a is formed by epitaxial growth, and the second n-type drift region 2b is formed in the surface of the first n−-type drift region 2a by photolithography and ion implantation.

Next, similar to the third embodiment, the p-type semiconductor region 13 and the second p-type semiconductor region 52 are selectively formed in the surface layer of the second n-type drift region 2b by photolithography and ion implantation. The width w3 of the p-type semiconductor region 13 and the width w4 of the second p-type semiconductor region 52 may be the same as in the third embodiment.

Next, similar to the third embodiment, an n-type epitaxial layer is formed by epitaxial growth so as to cover the p-type semiconductor region 13 whereby the thickness of the second n-type drift region 2b is increased. Next, an n−-type epitaxial layer constituting the third n+-type drift region 2c and the fourth n−-type drift region 2d is formed by epitaxial growth so as to cover the second n-type drift region 2b. Next, the third n+-type drift region 2c is selectively formed in the surface layer of the n−-type epitaxial layer by photolithography and ion implantation of an n-type impurity. Here, a mask used in the photolithography is adjusted so that the third n+-type drift region 2c is not formed in the entire surface of the n−-type epitaxial layer. In particular, the width w5 of the third n+-type drift region 2c is greater than the width w3 of the p-type semiconductor region 13 and less than the width w6 between gate trenches. Thus, the third n⁺-type drift region 2c and the fourth n⁻-type drift region 2d are formed in the surface of the second n-type drift region 2b. Next, similar to the third embodiment, on the third n⁺-type drift region 2c and the fourth n⁻-type drift region 2d, the p-type base region 3 is formed by epitaxial growth, producing the semiconductor base (silicon carbide epitaxial wafer) 10. Photolithography and ion implantation are repeatedly performed similar to the third embodiment whereby the n⁺-type source region 4 and the p⁺-type contact region 14 are sequentially and selectively formed in the surface layer of the p-type base region 3. The state up to here is depicted in FIG. 24.

Thereafter, the contact trench 8 is formed and subsequent processes are sequentially performed similar to the first embodiment whereby the trench-type SiC-MOSFET depicted in FIG. 23 is completed.

As described, according to the sixth embodiment, effects similar to those of the first embodiment may be obtained. Further, according to the sixth embodiment, the fourth n⁻-type drift region 2d having an impurity concentration that is lower than that of the first n⁻-type drift region 2a is in contact with the gate trench 51. Therefore, effects similar to those of the fifth embodiment may be obtained. Further, according to the sixth embodiment, since the second p-type semiconductor region is provided, effects similar to those of the third embodiment may be obtained.

Figure 25:
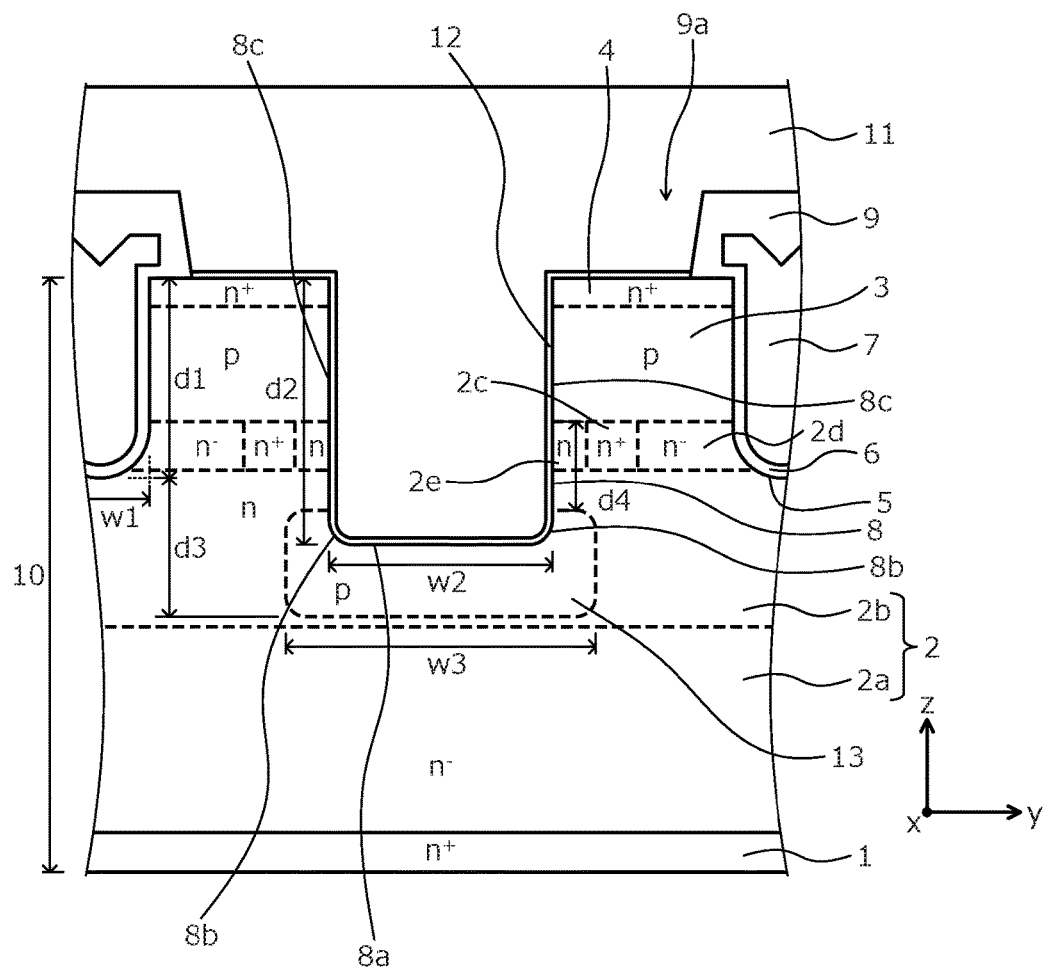
FIG. 25 is a cross-sectional view of a structure of the active region of the semiconductor device according to a seventh embodiment.

A structure of the semiconductor device according to a seventh embodiment will be described. FIG. 25 is a cross-sectional view of a structure of the active region of the semiconductor device according to the seventh embodiment. A planar layout near the contact trench 8 in FIG. 25 is similar to that of the first embodiment (refer to FIG. 2). The semiconductor device according to the seventh embodiment differs from the semiconductor device according to the fifth embodiment in that an n-type region (third silicon carbide semiconductor region) (hereinafter, fifth n-type drift region) 2e is provided on the first side of the third n⁺-type drift region 2c. A first side of the fifth n-type drift region 2e (the first side faces toward the gate trench 5) is in contact with the third n⁺-type drift region 2c; and a second side of the fifth n-type drift region 2e (the second side is opposite the first side) is in contact with the contact trench 8. Further, a film thickness of the fifth n-type drift region 2e is about the same as that of the third n⁺-type drift region 2c; a third side of the fifth n-type drift region 2e (the third side faces toward the source electrode 11) is in contact with the p-type base region 3; and a fourth side of the fifth n-type drift region 2e (the fourth side faces toward the n⁺-type drain layer 1) is in contact with the second n-type drift region 2b.

Figure 26:
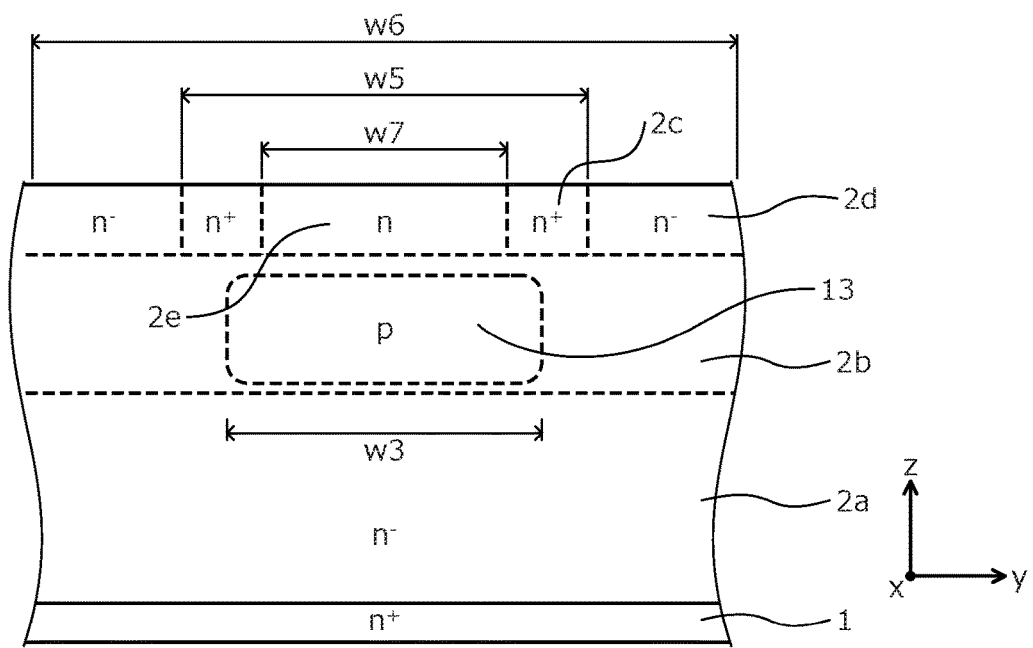
FIG. 26 is a cross-sectional view of the semiconductor device according to the seventh embodiment during manufacture.

The method of manufacturing a semiconductor device according to the seventh embodiment will be described taking as an example, a case where a 3300V trench-type SiC-MOSFET is produced. FIG. 26 is a cross-sectional view of the semiconductor device according to the seventh embodiment during manufacture. The method of manufacturing a semiconductor device according to the seventh embodiment, for example, includes in the method of manufacturing a semiconductor device according to the first embodiment, selectively forming the third n⁺-type drift region 2c, the fourth n⁻-type drift region 2d, and the fifth n-type drift region 2e in the surface of the second n-type drift region 2b. In particular, first, similar to the first embodiment, on the front surface of a silicon carbide substrate (semiconductor wafer) constituting the n⁺-type drain layer 1, the first n⁻-type drift region 2a is formed by epitaxial growth, and the second n-type drift region 2b is formed in the surface layer of the first n⁻-type drift region 2a by photolithography and ion implantation.

Next, similar to the first embodiment, the p-type semiconductor region 13 is selectively formed in the surface layer of the second n-type drift region 2b by photolithography and ion implantation. The width w3 of the p-type semiconductor region 13 may be the same as in the first embodiment.

Next, similar to the first embodiment, an n-type epitaxial layer is formed by epitaxial growth so as to cover the p-type semiconductor region 13 whereby the thickness of the second n-type drift region 2b is increased. Next, an n⁻-type epitaxial layer constituting the third n⁺-type drift region 2c, the fourth n⁻-type drift region 2d, and the fifth n-type drift region 2e is formed by epitaxial growth so as to cover the second n-type drift region 2b. Next, the third n⁺-type drift region 2c and the fifth n-type drift region 2e are selectively formed in the surface layer of the n⁻-type epitaxial layer by repeatedly performing photolithography and ion implantation of an n-type impurity. Here, a mask used in the photolithography is adjusted so that the third n⁺-type drift region 2c and the fifth n-type drift region 2e are not formed in the entire surface of the n⁻-type epitaxial layer. In particular, a width w7 of the fifth n-type drift region 2e is greater than the width w2 of the contact trench 8 and less than the width w3 of the p-type semiconductor region 13. Further, the width w5 of the third n⁺-type drift region 2c (the width w5 encompassing that of the fifth n-type drift region 2e) is greater than the width w3 of the p-type semiconductor region 13 and less than the width w6 between gate trenches. As a result, the third n⁺-type drift region 2c, the fourth n⁻-type drift region 2d, and the fifth n-type drift region 2e are formed in the surface of the second n-type drift region 2b. Next, similar to the third embodiment, the p-type base region 3 is formed on the third n⁺-type drift region 2c, the fourth n⁻-type drift region 2d, and the fifth n-type drift region 2e by epitaxial growth, producing the semiconductor base (silicon carbide epitaxial wafer) 10. Photolithography and ion implantation are repeatedly performed similar to the third embodiment whereby the n⁺-type source region 4 and the p⁺-type contact region 14 are sequentially and selectively formed in the surface layer of the p-type base region 3. The state up to here is depicted in FIG. 26.

Thereafter, the contact trench 8 is formed and subsequent processes are sequentially performed similar to the first embodiment whereby the trench-type SiC-MOSFET depicted in FIG. 25 is completed.

As described, according to the seventh embodiment, effects similar to those of the first embodiment may be obtained. Further, according to the seventh embodiment, the fourth n⁻-type drift region 2d having an impurity concentration that is lower than that of the first n⁻-type drift region 2a is in contact with the gate trench 5. Therefore, effects similar to those of the fifth embodiment may be obtained.

Figure 27:
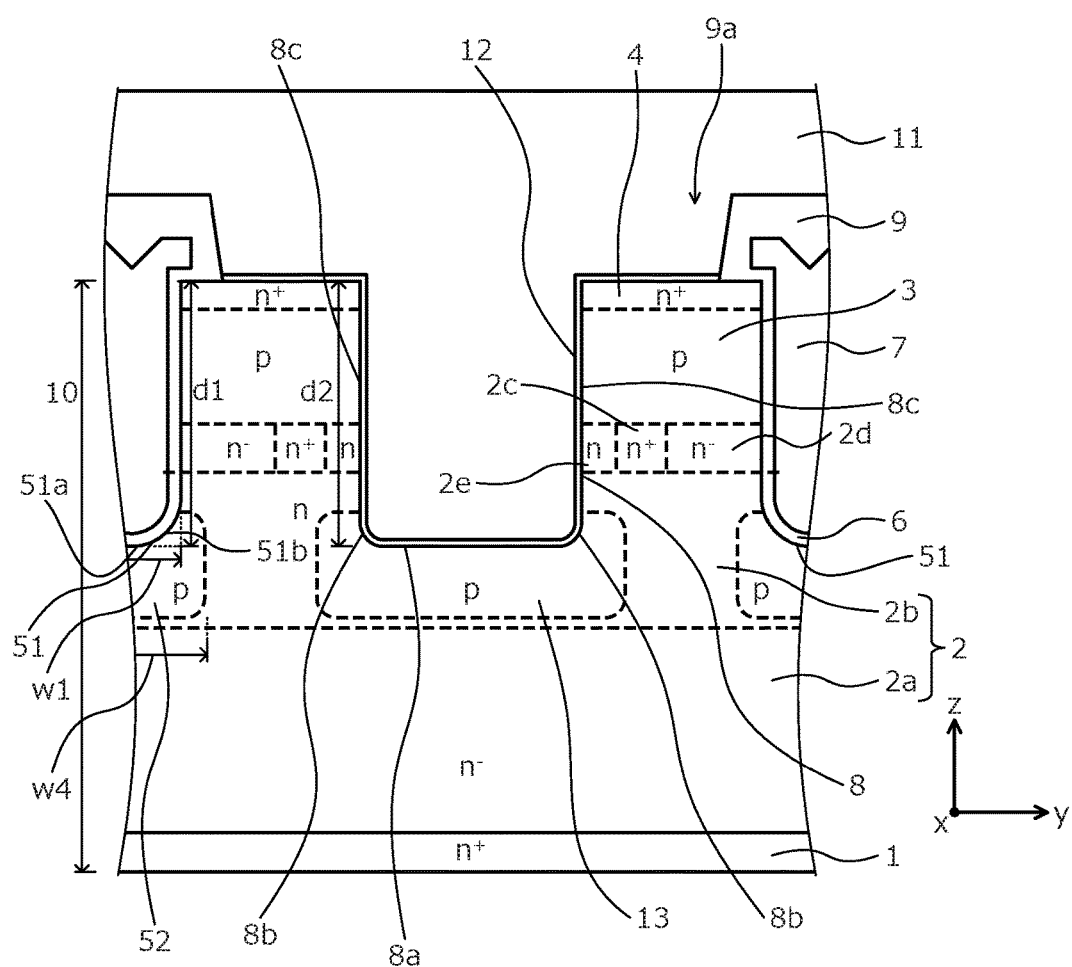
FIG. 27 is a cross-sectional view of a structure of the active region of the semiconductor device according to an eighth embodiment.

A structure of the semiconductor device according to an eighth embodiment will be described. FIG. 27 is a cross-sectional view of a structure of the active region of the semiconductor device according to the eighth embodiment. A planar layout near the contact trench 8 in FIG. 27 is similar to that of the first embodiment (refer to FIG. 2). The semiconductor device according to the eighth embodiment differs from the semiconductor device according to the sixth embodiment in that the fifth n-type drift region 2e is provided on the first side of the third n⁺-type drift region 2c. The first side of the fifth n-type drift region 2e (the first side faces toward the gate trench 5) is in contact with the third n⁺-type drift region 2c; and the second side of the fifth n-type drift region 2e (the second side is opposite the first side) is in contact with the contact trench 8. Further, a film thickness of the fifth n-type drift region 2e is about the same as that of the third n$^+$-type drift region 2c; the third side of the fifth n-type drift region 2e (the third side faces toward the source electrode 11) is in contact with the p-type base region 3; and the fourth side of the fifth n-type drift region 2e (the fourth side faces toward the n$^+$-type drain layer 1) is in contact with the second n-type drift region 2b.

Figure 28:
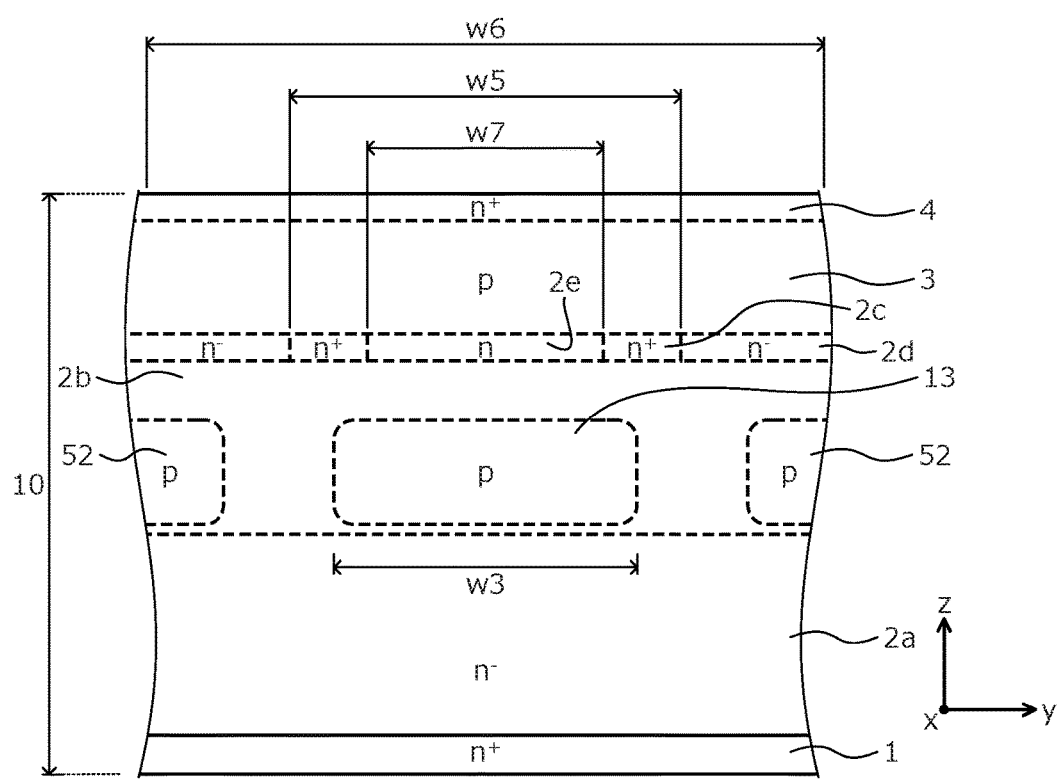
FIG. 28 is a cross-sectional view of the semiconductor device according to the eighth embodiment during manufacture.

The method of manufacturing a semiconductor device according to the eighth embodiment will be described taking as an example, a case where a 3300V trench-type SiC-MOSFET is produced. FIG. 28 is a cross-sectional view of the semiconductor device according to the eighth embodiment during manufacture. The method of manufacturing a semiconductor device according to the eighth embodiment, for example, includes in the method of manufacturing a semiconductor device according to the third embodiment, selectively forming the third n$^+$-type drift region 2c, the fourth n$^-$-type drift region 2d, and the fifth n-type drift region 2e in the surface of the second n-type drift region 2b. In particular, first, similar to the third embodiment, on the front surface of a silicon carbide substrate (semiconductor wafer) constituting the n$^+$-type drain layer 1, the first n$^-$-type drift region 2a is formed by epitaxial growth, and the second n-type drift region 2b is formed in the surface layer of the first n$^-$-type drift region 2a by photolithography and ion implantation.

Next, similar to the third embodiment, the p-type semiconductor region 13 and the second p-type semiconductor region 52 are selectively formed in the surface layer of the second n-type drift region 2b by photolithography and ion implantation. The width w3 of the p-type semiconductor region 13 and the width w4 of the second p-type semiconductor region 52 may be the same as in the third embodiment.

Next, similar to the third embodiment, an n-type epitaxial layer is formed by epitaxial growth so as to cover the p-type semiconductor region 13 whereby the thickness of the second n-type drift region 2b is increased. Next, an n$^-$-type epitaxial layer constituting the third n$^+$-type drift region 2c, the fourth n$^-$-type drift region 2d, and the fifth n-type drift region 2e is formed by epitaxial growth so as to cover the second n-type drift region 2b. Next, the third n$^+$-type drift region 2c and the fifth n-type drift region 2e are selectively formed in the surface layer of the n$^-$-type epitaxial layer by repeatedly performing photolithography and ion implantation of an n-type impurity. Here, a mask used in the photolithography is adjusted so that the third n$^+$-type drift region 2c and the fifth n-type drift region 2e are not formed in the entire surface of the n$^-$-type epitaxial layer. In particular, the width w7 of the fifth n-type drift region 2e is greater than the width w2 of the contact trench 8 and less than the width w3 of the p-type semiconductor region 13. Further, the width w5 of the third n$^+$-type drift region 2c (the width w5 encompassing that of the fifth n-type drift region 2e) is greater than the width w3 of the p-type semiconductor region 13 and less than the width w6 between gate trenches. As a result, the third n$^+$-type drift region 2c, the fourth n$^-$-type drift region 2d, and the fifth n-type drift region 2e are formed in the surface of the second n-type drift region 2b. Next, similar to the third embodiment, the p-type base region 3 is formed on the third n$^+$-type drift region 2c, the fourth n$^-$-type drift region 2d, and the fifth n-type drift region 2e by epitaxial growth, producing the semiconductor base (silicon carbide epitaxial wafer) 10. Photolithography and ion implantation are repeatedly performed similar to the third embodiment whereby the n$^+$-type source region 4 and the p$^+$-type contact region 14 are sequentially and selectively formed in the surface layer of the p-type base region 3. The state up to here is depicted in FIG. 28.

Thereafter, the contact trench 8 is formed and subsequent processes are sequentially performed similar to the first embodiment whereby the trench-type SiC-MOSFET depicted in FIG. 27 is completed.

As described, according to the eighth embodiment, effects similar to those of the first embodiment may be obtained. Further, according to the eighth embodiment, the fourth n$^-$-type drift region 2d having an impurity concentration that is lower than that of the first n$^-$-type drift region 2a is in contact with the gate trench 51. Therefore, effects similar to those of the fifth embodiment may be obtained. Further, according to the eighth embodiment, the second p-type semiconductor region is provided, enabling effects similar to those of the third embodiment to be obtained.

Figure 29:
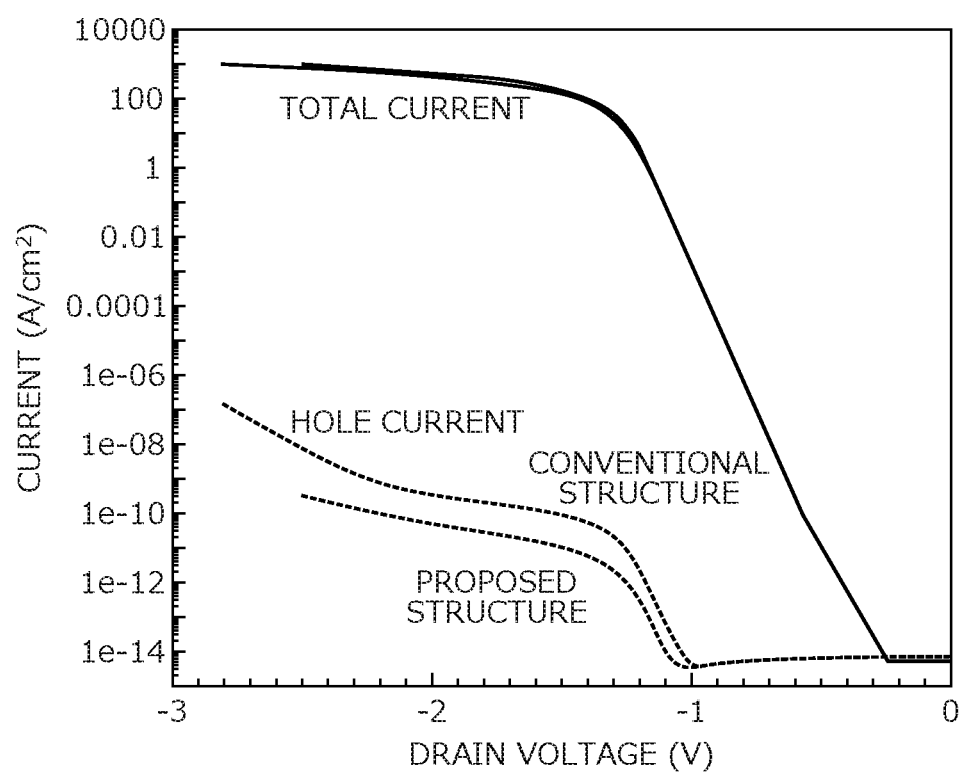
FIGS. 29 and 30 are graphs depicting measured values of current between a source and a drain in a semiconductor device according to a second conventional example and the semiconductor device according to the third embodiment.
Figure 30:
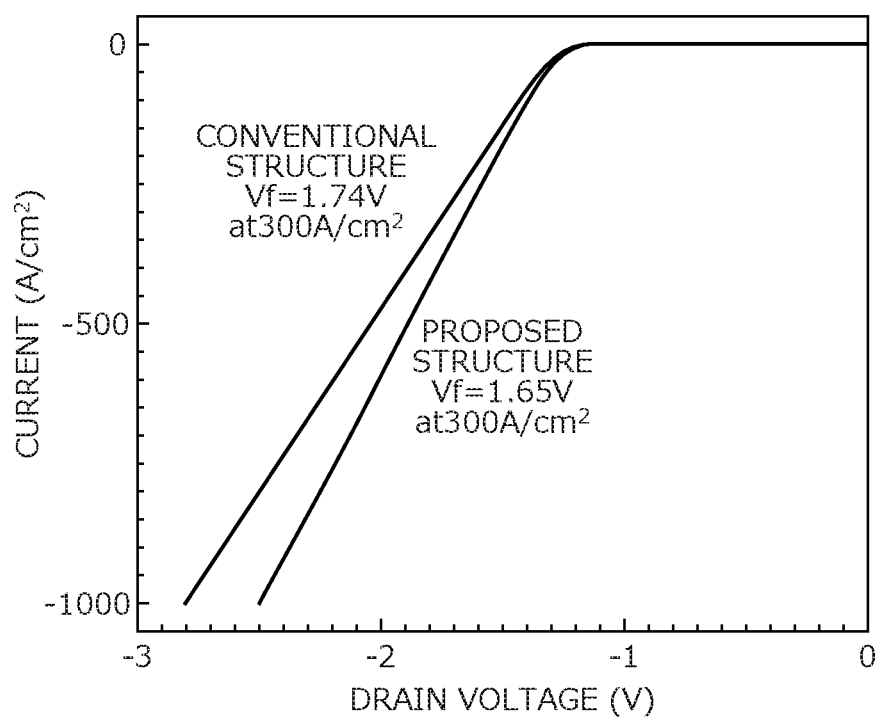
Figure 31:
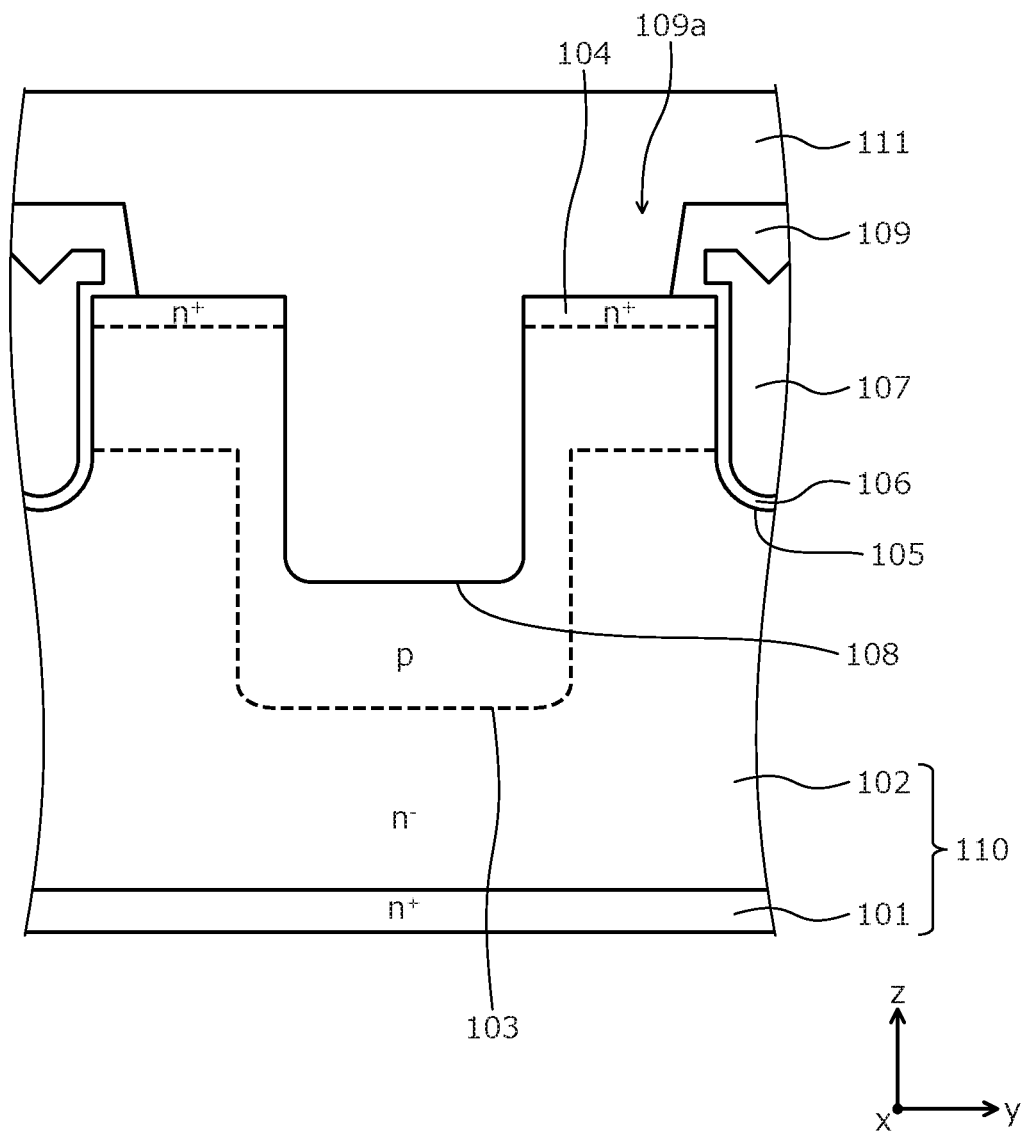
FIG. 31 is a cross-sectional view of a structure of an active region of a conventional trench-type SiC-MOSFET.

FIGS. 29 and 30 are graphs depicting measured values of the current between the source and the drain in the semiconductor device according to the second conventional example and the semiconductor device according to the third embodiment. FIGS. 29 and 30 are graphs depicting the current between the source and the drain against the drain voltage when the semiconductor device is off, i.e., when positive voltage is applied to the front electrode and negative voltage is applied to the drain electrode. In FIG. 29, the absolute value of the current between the source and the drain is expressed on a logarithmic scale.

According to FIG. 29, it is found that hole current in the semiconductor device according to the third embodiment is lower than hole current in the semiconductor device according to the second conventional example. In this manner, the semiconductor device according to the third embodiment may prevent the parasitic pn diode from turning on since the hole current is low.

Further, according to FIG. 30, it is found that the total current in the semiconductor device according to the third embodiment is lower than the total current in the semiconductor device according to the second conventional example. As a result, it is found that the resistance of the n-type drift region in the semiconductor device according to the third embodiment decreased.

In the embodiments of the present invention, various modifications are possible within a scope not deviating from the spirit of the invention. For example, dimensions, impurity concentrations, formation conditions for regions, etc. may be variously set according to required specifications. Further, in the embodiments, while the first conductivity type is assumed to be an n-type and a second conductivity type is assumed to be a p-type, the present invention is similarly implemented when the first conductivity type is a p-type and the second conductivity type is an n-type.

According to the embodiments, the third n$^+$-type drift region (first silicon carbide semiconductor region of the first conductivity type) having an impurity concentration higher than that of the second n-type drift region is provided between the second n-type drift region (first silicon carbide semiconductor layer of the first conductivity type) and the p-type base region (second silicon carbide semiconductor layer of the second conductivity type). Here, at the n-type drift region that is the part between the p-type regions of the p-type semiconductor region (first semiconductor region of the second conductivity type) and the p-type base region, parasitic resistance is easily generated and the resistance of the n-type drift region increases due to the parasitic resistance. The impurity concentration of the third n$^+$-type drift region between the p-type regions is increased whereby the resistance of the n-type drift region may be reduced. As a result, when the parasitic Schottky diode is on, the hole current is decreased and the parasitic pn diode may be prevented from turning on.

The semiconductor device and the method of manufacturing a semiconductor device according to the embodiments achieve an effect in that the resistance of the drift region is reduced, enabling the parasitic pn diode to be prevented from turning on.

As described, the semiconductor device and the method of manufacturing a semiconductor device according to the embodiments are useful for semiconductor devices used in power converting equipment such as converters and inverters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a first semiconductor region of a second conductivity type selectively provided in a first silicon carbide semiconductor layer of a first conductivity type, the first semiconductor region provided at a position deeper than a surface of the first silicon carbide semiconductor layer;
   a first silicon carbide semiconductor region of the first conductivity type that is provided in the surface of the first silicon carbide semiconductor layer and that has an impurity concentration that is higher than that of the first silicon carbide semiconductor layer;
   a second silicon carbide semiconductor layer of the second conductivity type provided on a surface of the first silicon carbide semiconductor region;
   a second semiconductor region of the first conductivity type selectively provided in the second silicon carbide semiconductor layer;
   a first trench penetrating the second semiconductor region, the second silicon carbide semiconductor layer, and the first silicon carbide semiconductor region, and reaching the first silicon carbide semiconductor layer;
   a second trench that is provided separated from the first trench, that penetrates the second semiconductor region, the second silicon carbide semiconductor layer, the first silicon carbide semiconductor region, and the first silicon carbide semiconductor layer, and that reaches the first semiconductor region;
   a gate electrode provided in the first trench, via a gate insulating film; and
   a metal electrode that is provided in contact with the second semiconductor region, the second silicon carbide semiconductor layer, and the first silicon carbide semiconductor region, that is embedded in the second trench so as to be in contact with the first semiconductor region at a bottom and a corner of the second trench, and that forms a Schottky junction with the first silicon carbide semiconductor region and the first silicon carbide semiconductor layer at a side wall of the second trench.

2. The semiconductor device according to claim 1, wherein
   the first silicon carbide semiconductor region is selectively provided in a surface of the first silicon carbide semiconductor layer, and
   the second silicon carbide semiconductor layer is provided on surfaces of the first silicon carbide semiconductor layer and the first silicon carbide semiconductor region.

3. The semiconductor device according to claim 1, wherein
   the first silicon carbide semiconductor region is selectively provided in a surface of the first silicon carbide semiconductor layer,
   wherein the semiconductor device further comprises a second silicon carbide semiconductor region of the first conductivity type that is provided in the surface of the first silicon carbide semiconductor layer so as to be in contact with the first silicon carbide semiconductor region and the first trench, and that has an impurity concentration that is higher than that of the first silicon carbide semiconductor layer, and
   wherein the second silicon carbide semiconductor layer is provided on a surface of the first silicon carbide semiconductor region and a surface of the second silicon carbide semiconductor region.

4. The semiconductor device according to claim 1, wherein
   the first silicon carbide semiconductor region is selectively provided in a surface of the first silicon carbide semiconductor layer,
   wherein the semiconductor device further comprises:
      a second silicon carbide semiconductor region of the first conductivity type that is provided in the surface of the first silicon carbide semiconductor layer so as to be in contact with the first silicon carbide semiconductor region and the first trench, and that has an impurity concentration that is lower than that of the first silicon carbide semiconductor layer; and
      a third silicon carbide semiconductor region of the first conductivity type provided in the surface of the first silicon carbide semiconductor layer so as to be in contact with the first silicon carbide semiconductor region and the second trench, and
   wherein the second silicon carbide semiconductor layer is provided on the surface of the first silicon carbide semiconductor region, a surface of the second silicon carbide semiconductor region, and a surface of the third silicon carbide semiconductor region.

5. The semiconductor device according to claim 1, wherein the first semiconductor region has a width that is wider than that of the second trench.

6. The semiconductor device according to claim 1, wherein the second trench has a depth that is equal to or greater than that of the first trench.

7. The semiconductor device according to claim 1, further comprising a fourth semiconductor region of the second conductivity type that is selectively provided in the first silicon carbide semiconductor layer, and that faces the gate electrode via the gate insulating film at a bottom and a corner of the first trench.

8. The semiconductor device according to claim 7, wherein the second trench has a depth that is equal to or less than that of the first trench.

9. The semiconductor device according to claim 1, further comprising a fifth semiconductor region of the second conductivity type that is selectively provided in the second silicon carbide semiconductor layer, and that has an impurity concentration that is higher than that of the second silicon carbide semiconductor layer,
   wherein the first trench and the second trench are arranged in a direction, and wherein the second semiconductor region and the fifth semiconductor region are arranged to repeatedly alternate along a direction orthogonal to the direction along which the first trench and the second trench are arranged.

10. The semiconductor device according to claim 1, further comprising a third silicon carbide semiconductor layer of the first conductivity type that is provided on a first surface of the first silicon carbide semiconductor layer that is opposite a second surface of the first silicon carbide semiconductor layer which faces toward the second silicon carbide semiconductor layer, and that has an impurity concentration that is higher than that of the first silicon carbide semiconductor layer.

11. A method of manufacturing a semiconductor device, the method comprising:
    selectively forming a first semiconductor region of a second conductivity type in a first silicon carbide semiconductor layer of a first conductivity type, at a position that is deeper than a surface of the first silicon carbide semiconductor layer;
    forming a first silicon carbide semiconductor region of the first conductivity type in the surface of the first silicon carbide semiconductor layer, the first silicon carbide semiconductor region having an impurity concentration that is higher than that of the first silicon carbide semiconductor layer;
    forming a second silicon carbide semiconductor layer of the second conductivity type on a surface of the first silicon carbide semiconductor region;
    selectively forming a second semiconductor region of the first conductivity type in the second silicon carbide semiconductor layer;
    forming a first trench that penetrates the second semiconductor region, the second silicon carbide semiconductor layer, and the first silicon carbide semiconductor region, and that reaches the first silicon carbide semiconductor layer;
    forming a second trench that is separated from the first trench, that penetrates the second semiconductor region, the second silicon carbide semiconductor layer, the first silicon carbide semiconductor region, and the first silicon carbide semiconductor layer, and that reaches the first semiconductor region;
    forming a gate electrode in the first trench, via a gate insulating film; and
    embedding a metal electrode in the second trench so as to be in contact with the first semiconductor region at a bottom and a corner of the second trench, the metal electrode being formed to be in contact with the second semiconductor region, the second silicon carbide semiconductor layer, and the first silicon carbide semiconductor region, and the metal electrode forming a Schottky junction with the first silicon carbide semiconductor region and the first silicon carbide semiconductor layer at a side wall of the second trench.

12. The method of according to claim 11, wherein the first silicon carbide semiconductor region is selectively provided in the surface of the first silicon carbide semiconductor layer, and the second silicon carbide semiconductor layer is provided on the surfaces of the first silicon carbide semiconductor layer and the first silicon carbide semiconductor region.

13. The method according to claim 11, wherein the first silicon carbide semiconductor region is selectively provided in the surface of the first silicon carbide semiconductor layer,
    wherein the method further comprises forming a second silicon carbide semiconductor region of the first conductivity type in the surface of the first silicon carbide semiconductor layer so as to be in contact with the first silicon carbide semiconductor region and the first trench, the second silicon carbide semiconductor region having an impurity concentration that is higher than that of the first silicon carbide semiconductor layer, and being formed after forming the first silicon carbide semiconductor region and before forming the second silicon carbide semiconductor layer, and
    wherein the second silicon carbide semiconductor layer is formed on the surface of the first silicon carbide semiconductor region and a surface of the second silicon carbide semiconductor region.

14. The method according to claim 11, wherein the first silicon carbide semiconductor region is selectively provided in the surface of the first silicon carbide semiconductor layer,
    wherein the method further comprises:
        forming a second silicon carbide semiconductor region of the first conductivity type in the surface of the first silicon carbide semiconductor layer so as to be in contact with the first silicon carbide semiconductor region and the first trench, the second silicon carbide semiconductor region having an impurity concentration that is lower than that of the first silicon carbide semiconductor layer, and being formed after forming the first silicon carbide semiconductor region and before forming the second silicon carbide semiconductor layer; and
        forming a third silicon carbide semiconductor region of the first conductivity type in the surface of the first silicon carbide semiconductor layer so as to be in contact with the first silicon carbide semiconductor region and the second trench, the third silicon carbide semiconductor region being formed after forming the first silicon carbide semiconductor region and before forming the second silicon carbide semiconductor layer, and
    wherein the second silicon carbide semiconductor layer is formed on the surface of the first silicon carbide semiconductor region, the surface of the second silicon carbide semiconductor region, and a surface of the third silicon carbide semiconductor region.

15. The method according to claim 11, wherein forming the first semiconductor region includes selectively forming a fourth semiconductor region of the second conductivity type in the first silicon carbide semiconductor layer, the fourth semiconductor region facing the gate electrode via the gate insulating film at a bottom and a corner of the first trench.

* * * * *